US011892693B1

(12) United States Patent
Mendoza et al.

(10) Patent No.: US 11,892,693 B1
(45) Date of Patent: Feb. 6, 2024

(54) PHOTONIC QUANTUM COMPUTER ASSEMBLY

(71) Applicant: Psiquantum, Corp., Palo Alto, CA (US)

(72) Inventors: Gabriel J. Mendoza, San Francisco, CA (US); Matteo Staffaroni, San Ramon, CA (US); Albert Wang, Sunnyvale, CA (US); John Eugene Berg, Palo Alto, CA (US); Ramakanth Alapati, Dublin, CA (US)

(73) Assignee: Psiquantum, Corp., Palo Alto, CA (US)

( * ) Notice: Subject to any disclaimer, the term of this patent is extended or adjusted under 35 U.S.C. 154(b) by 0 days.

(21) Appl. No.: 17/951,916

(22) Filed: Sep. 23, 2022

Related U.S. Application Data

(62) Division of application No. 16/576,626, filed on Sep. 19, 2019, now Pat. No. 11,493,713.

(60) Provisional application No. 62/733,482, filed on Sep. 19, 2018.

(51) Int. Cl.
*G02B 6/43* (2006.01)
*H01L 25/065* (2023.01)
*G02B 6/12* (2006.01)
*H01L 23/00* (2006.01)
*G06N 10/00* (2022.01)

(52) U.S. Cl.
CPC ........... *G02B 6/43* (2013.01); *G02B 6/12002* (2013.01); *G06N 10/00* (2019.01); *H01L 24/47* (2013.01); *H01L 25/0657* (2013.01); *G02B 2006/12061* (2013.01)

(58) Field of Classification Search
CPC .............. G02B 6/43; G02B 6/12002; G02B 2006/12061; G06N 10/00; H01L 24/47; H01L 25/0657
See application file for complete search history.

(56) References Cited

U.S. PATENT DOCUMENTS

| 5,111,419 A | 5/1992 | Morley, Jr. et al. |
| 5,225,836 A | 7/1993 | Morley, Jr. et al. |
| 5,357,251 A | 10/1994 | Morley, Jr. et al. |
| 6,151,257 A | 11/2000 | Jeffrey et al. |
| 6,330,378 B1 | 12/2001 | Forrest et al. |
| 6,718,079 B1 | 4/2004 | Gidon |
| 7,554,167 B2 | 6/2009 | Vaganov |

(Continued)

FOREIGN PATENT DOCUMENTS

WO 2018063204 A1 4/2018

OTHER PUBLICATIONS

Kelly, "A Preview of Bristlecone, Google's New Quantum Processor", Google AI Blog, Available online at: https://ai.googleblog.com/2018/03/a-preview-of-bristlecone-googles-new.html, Mar. 5, 2018, 3 pages.

(Continued)

*Primary Examiner* — Andrew Jordan
(74) *Attorney, Agent, or Firm* — Kilpatrick Townsend & Stockton LLP

(57) ABSTRACT

A device includes a die stack including a first die including a quantum circuit and a second die including an electronic circuit. The second die and the first die face each other. The device also includes a first interconnect between the quantum circuit and the electronic circuit and a second interconnect between the quantum circuit and the electronic circuit.

11 Claims, 14 Drawing Sheets

(56) References Cited

U.S. PATENT DOCUMENTS

| | | | |
|---|---|---|---|
| 8,004,052 B2 | 8/2011 | Vaganov | |
| 8,212,367 B2 | 7/2012 | Ronen | |
| 8,350,345 B2 | 1/2013 | Vaganov | |
| 9,058,458 B2 | 6/2015 | Shapiro et al. | |
| 9,059,163 B2 | 6/2015 | Shapiro et al. | |
| 9,064,861 B2 | 6/2015 | Musk | |
| 9,391,708 B2 | 7/2016 | Fincato et al. | |
| 9,681,558 B2 | 6/2017 | Chen et al. | |
| 10,041,978 B2 | 8/2018 | Salles et al. | |
| 10,162,139 B1 | 12/2018 | Wang et al. | |
| 10,175,554 B2 | 1/2019 | Grice et al. | |
| 10,267,990 B1 | 4/2019 | Yu et al. | |
| 10,365,436 B2 | 7/2019 | Byrd et al. | |
| 10,371,893 B2 | 8/2019 | Yu et al. | |
| 10,379,420 B1 | 8/2019 | Wang | |
| 10,380,496 B2 | 8/2019 | Elsherbini et al. | |
| 10,381,541 B2 | 8/2019 | Das et al. | |
| 10,396,269 B2 | 8/2019 | Oliver et al. | |
| 10,481,351 B2 | 11/2019 | Wang et al. | |
| 10,586,909 B2 | 3/2020 | Das et al. | |
| 10,598,875 B2 | 3/2020 | Xie | |
| 10,620,390 B2 | 4/2020 | Fish et al. | |
| 10,748,844 B2 | 8/2020 | Kumar et al. | |
| 10,862,730 B2 | 12/2020 | Vadivelu et al. | |
| 10,867,885 B2 | 12/2020 | Yu et al. | |
| 10,937,736 B2 | 3/2021 | Yu et al. | |
| 10,962,719 B2 | 3/2021 | Razdan et al. | |
| 10,989,887 B2 | 4/2021 | Lim et al. | |
| 11,035,752 B1 * | 6/2021 | Snyder | G01M 11/0214 |
| 11,043,478 B2 | 6/2021 | Traverso et al. | |
| 11,063,013 B2 | 7/2021 | Chen et al. | |
| 11,107,799 B1 | 8/2021 | Alapati et al. | |
| 11,119,385 B2 | 9/2021 | Wang | |
| 11,171,075 B2 | 11/2021 | Liu et al. | |
| 11,181,689 B2 | 11/2021 | Razdan et al. | |
| 11,257,763 B2 | 2/2022 | Lu et al. | |
| 11,275,109 B2 | 3/2022 | Sita et al. | |
| 11,493,713 B1 * | 11/2022 | Mendoza | G02B 6/12002 |
| 11,493,714 B1 * | 11/2022 | Mendoza | G06N 10/00 |
| 11,536,897 B1 * | 12/2022 | Thompson | G02B 6/4274 |
| 11,550,108 B1 * | 1/2023 | Mendoza | H01L 24/80 |
| 11,569,919 B2 * | 1/2023 | Wang | G06N 10/40 |
| 2005/0117834 A1 | 6/2005 | Joyner et al. | |
| 2005/0190152 A1 | 9/2005 | Vaganov | |
| 2009/0237275 A1 | 9/2009 | Vaganov | |
| 2011/0298705 A1 | 12/2011 | Vaganov | |
| 2014/0217606 A1 | 8/2014 | Cho | |
| 2014/0363172 A1 | 12/2014 | Pelley et al. | |
| 2015/0076661 A1 | 3/2015 | Musk | |
| 2015/0109739 A1 | 4/2015 | Shapiro et al. | |
| 2015/0113495 A1 | 4/2015 | Shapiro et al. | |
| 2015/0253511 A1 | 9/2015 | Pelley | |
| 2015/0341119 A1 | 11/2015 | Fincato et al. | |
| 2015/0369845 A1 | 12/2015 | Salles et al. | |
| 2016/0050768 A1 | 2/2016 | Chen et al. | |
| 2018/0012932 A1 | 1/2018 | Oliver et al. | |
| 2018/0102469 A1 | 4/2018 | Das et al. | |
| 2018/0102470 A1 | 4/2018 | Das et al. | |
| 2018/0196196 A1 | 7/2018 | Byrd et al. | |
| 2019/0006263 A1 | 1/2019 | Yu et al. | |
| 2019/0042964 A1 | 2/2019 | Elsherbini et al. | |
| 2019/0044785 A1 | 2/2019 | Vadivelu et al. | |
| 2019/0137706 A1 | 5/2019 | Xie | |
| 2019/0146166 A1 | 5/2019 | Wang et al. | |
| 2019/0162901 A1 | 5/2019 | Yu et al. | |
| 2019/0194016 A1 | 6/2019 | Roberts et al. | |
| 2019/0326266 A1 | 10/2019 | Traverso et al. | |
| 2019/0333905 A1 | 10/2019 | Raghunathan et al. | |
| 2020/0013697 A1 | 1/2020 | Yu et al. | |
| 2020/0013698 A1 | 1/2020 | Yu et al. | |
| 2020/0013699 A1 | 1/2020 | Liu et al. | |
| 2020/0072899 A1 | 3/2020 | Sita et al. | |
| 2020/0073050 A1 | 3/2020 | Byrd et al. | |
| 2020/0088960 A1 | 3/2020 | Wang et al. | |
| 2020/0219865 A1 | 7/2020 | Nelson et al. | |
| 2020/0241207 A1 | 7/2020 | Razdan et al. | |
| 2020/0273783 A1 | 8/2020 | Sankman et al. | |
| 2020/0301244 A1 | 9/2020 | Wang | |
| 2020/0310052 A1 | 10/2020 | Lim et al. | |
| 2020/0319416 A1 | 10/2020 | Patel et al. | |
| 2020/0365544 A1 | 11/2020 | Chen et al. | |
| 2020/0395302 A1 | 12/2020 | Yu et al. | |
| 2021/0064958 A1 | 3/2021 | Lin et al. | |
| 2021/0088722 A1 | 3/2021 | Razdan et al. | |
| 2021/0096310 A1 | 4/2021 | Chang et al. | |
| 2021/0166991 A1 | 6/2021 | Liu et al. | |
| 2021/0167016 A1 | 6/2021 | Lu et al. | |
| 2021/0201126 A1 | 7/2021 | Meng et al. | |
| 2021/0202562 A1 | 7/2021 | Chang et al. | |
| 2021/0270693 A1 * | 9/2021 | Snyder | G01M 11/0214 |
| 2021/0280568 A1 | 9/2021 | Traverso et al. | |
| 2021/0286140 A1 | 9/2021 | Winzer | |
| 2021/0305128 A1 | 9/2021 | Erickson et al. | |
| 2021/0310152 A1 * | 10/2021 | Liang | C30B 23/02 |
| 2021/0320722 A1 | 10/2021 | Wu et al. | |
| 2021/0343671 A1 | 11/2021 | Chen et al. | |
| 2021/0375846 A1 | 12/2021 | Chen et al. | |
| 2021/0407909 A1 | 12/2021 | Jadhav et al. | |
| 2022/0004079 A1 | 1/2022 | Wang | |
| 2022/0012617 A1 | 1/2022 | Hassel et al. | |
| 2022/0014277 A1 * | 1/2022 | Wang | G06N 10/40 |
| 2022/0045028 A1 | 2/2022 | Chang Chien et al. | |
| 2022/0045041 A1 | 2/2022 | Chang Chien et al. | |
| 2022/0045425 A1 * | 2/2022 | Tran | G10L 25/51 |
| 2022/0121978 A1 | 4/2022 | Woods et al. | |
| 2022/0181264 A1 | 6/2022 | Lu et al. | |
| 2022/0189922 A1 | 6/2022 | Abraham et al. | |
| 2022/0199507 A1 | 6/2022 | Abraham et al. | |
| 2023/0143564 A1 * | 5/2023 | Matsuura | G06N 10/40 |
| | | | 327/527 |

OTHER PUBLICATIONS

Rahim, et al., "Open-Access Silicon Photonics Platforms in Europe", IEEE Journal of Selected Topics in Quantum Electronics, vol. 25, No. 5, Sep.-Oct. 2019, 18 pages.

Roeloffzen, et al., "Low-Loss Si3N4 TripleX Optical Waveguides: Technology and Applications Overview", IEEE Journal of Selected Topics in Quantum Electronics, vol. 24, No. 4, Jul.-Aug. 2018, 21 pages.

U.S. Appl. No. 17/157,918, "Corrected Notice of Allowability", dated Aug. 3, 2022, 2 pages.

U.S. Appl. No. 17/157,918, "Notice of Allowance", dated Jun. 1, 2022, 18 pages.

U.S. Appl. No. 17/378,533, "Notice of Allowance", dated Sep. 19, 2022, 10 pages.

\* cited by examiner

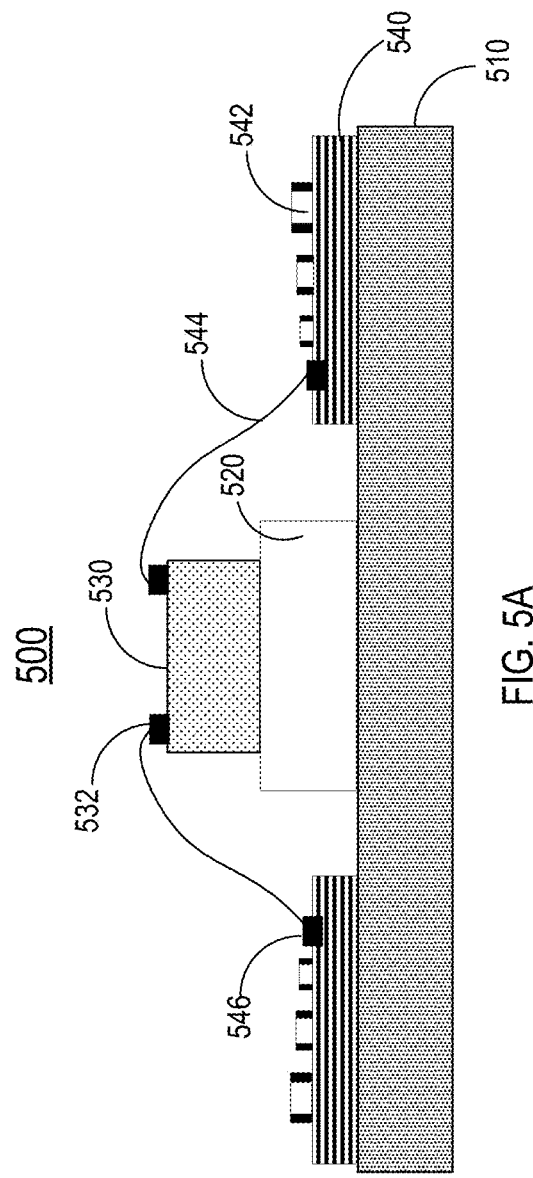
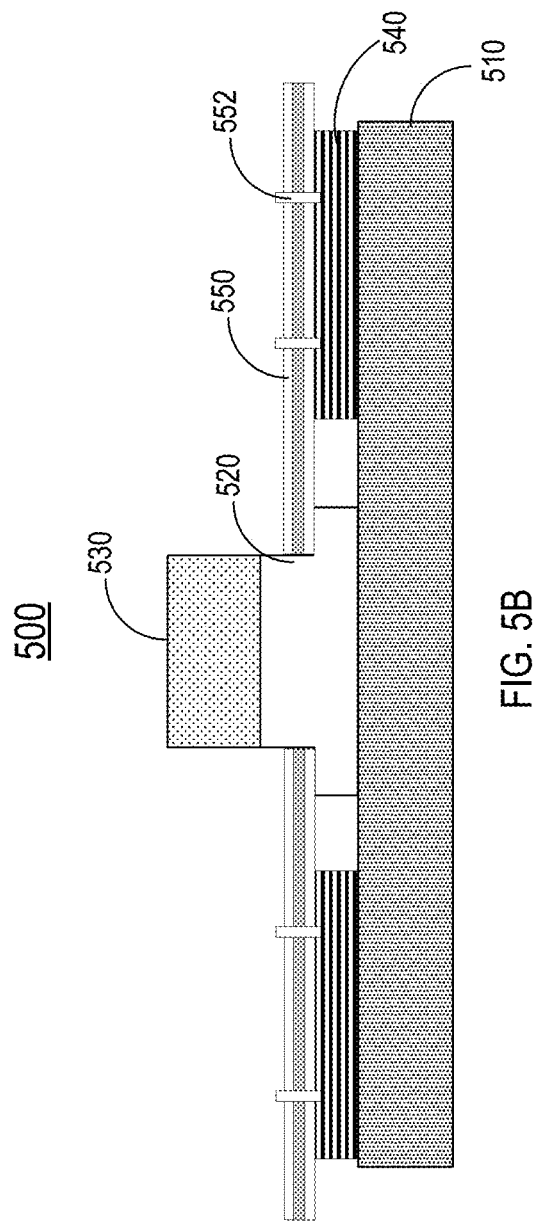

PHOTONIC QUANTUM COMPUTER ASSEMBLY

CROSS-REFERENCE TO RELATED APPLICATION

This application is a division of U.S. patent application Ser. No. 16/576,626, filed Sep. 19, 2019; which claims priority to U.S. Provisional Patent Application No. 62/733,482, filed Sep. 19, 2018, the disclosures of which are hereby incorporated by reference in their entirety for all purposes.

BACKGROUND

Photonic integrated circuits, such as silicon photonic integrated circuits, can be used in many systems, such as communication systems and optical quantum computing systems, which may also include may electronic integrated circuits. The electronic integrated circuits may be used to control the operations of the photonic integrated circuits, or to provide inputs to and/or process outputs from the photonic integrated circuits. In many high performance systems, the interconnects between the photonic integrated circuits and/or the electronic integrated circuits may significantly affect the performance of the systems. In addition, the assembly of the photonic integrated circuits and the electronic integrated circuits may be time consuming and costly. Furthermore, in some applications, such as in some optical quantum computers, the photonic integrated circuits and/or the electronic integrated circuits may work in extreme conditions, such as cryogenic temperature, which may make it even more difficult to integrate the photonic integrated circuits and the electronic integrated circuits.

SUMMARY

Techniques disclosed herein relate generally to integrating photonic integrated circuits and electronic integrated circuits in a hybrid system. In one embodiment, photonic integrated circuits and electronic integrated circuits are included in a same package, which may also include optical and electrical cables, such as optical fibers and electrical ribbon cables. The packaged system may function at cryogenic temperatures. Various inventive embodiments are described herein, including methods, processes, systems, devices, and the like.

In accordance with an example implementation, a device may include a silicon substrate, a die stack on the silicon substrate, and a first printed circuit board (PCB) on the silicon substrate, where the first PCB may be electrically coupled to the die stack. The die stack may include a photonic integrated circuit (PIC) die including a photonic integrated circuit, and an electronic integrated circuit (EIC) die including an electronic integrated circuit, where the EIC die and the PIC die may be bonded face-to-face such that the photonic integrated circuit and the electronic integrated circuit face each other. In some embodiments, the die stack may be bonded to the silicon substrate through fusion bonding. In some embodiments, the EIC die and the PIC die may be bonded face-to-face using fusion bonding or hybrid bonding. In some embodiments, the first PCB may include a silicon, oxide, ceramic, or organic material. The first PCB may be bonded to the silicon substrate using an epoxy, fusion bonding, or hybrid bonding.

In some embodiments, the device may include a plurality of optical fibers coupled to the photonic integrated circuit. The plurality of optical fibers may be positioned on top of and supported by the first PCB. In some embodiments, a second PCB may be positioned on top of the plurality of optical fibers and the first PCB such that the plurality of optical fibers may be sandwiched by the first PCB and the second PCB. In some embodiments, the plurality of optical fibers may be surface-normally coupled to the photonic integrated circuit on the PIC die. In some embodiments, the PIC die may include a plurality of V-grooves, where each of the plurality of optical fibers may be aligned with and coupled to the photonic integrated circuit through a respective V-groove in the plurality of V-grooves.

In some embodiments, the EIC die may include bonding pads on a surface of the EIC die opposite to a bonding interface between the EIC die and the PIC die, and the bonding pads may be connected to the first PCB through bonding wires. In some embodiments, the plurality of optical fibers may be coupled to the photonic integrated circuit on a first side of the die stack, and the bonding pads and the bonding wires may be on a second side of the die stack different from the first side. In some embodiments, the EIC die may include one or more through silicon vias (TSVs) that connect the bonding pads to the electronic integrated circuit.

In some embodiments, the die stack may include a glass substrate that may include bonding pads on a first surface of the glass substrate opposite to a bonding interface between the EIC die and the PIC die, where the bonding pads may be connected to the first PCB through bonding wires. The glass substrate may also include contact pads on a second surface of the glass substrate opposite to the first surface, where the contact pads may be coupled to the photonic integrated circuit or the electronic integrated circuit. The glass substrate may further include one or more through glass vias (TGVs) connecting the bonding pads and the contact pads.

In accordance with an example implementation, a method may include aligning a photonic integrated circuit (PIC) on a PIC wafer with an electronic integrated circuit (EIC) on an EIC wafer, bonding the PIC wafer and the EIC wafer face-to-face using fusion bonding or hybrid bonding such that the PIC and EIC face each other, and cutting the bonded PIC wafer and EIC wafer to singulate a plurality of die stacks such that each die stack may include a PIC die and an EIC die. In some embodiments, the method may further include fusion-bonding a die stack in the plurality of die stacks to a silicon substrate, bonding a first printed circuit board (PCB) on the silicon substrate, and wire-bonding the die stack to the first PCB.

In some embodiments, the method may further include forming bonding pads on a surface of the EIC wafer opposite to an interface between the PIC wafer and the EIC wafer. In some embodiments, the method may include thinning (e.g., back-grinding) the EIC wafer, and forming a redistribution layer on the surface of the EIC wafer before forming the bonding pads. In some embodiments, the method may further include thinning the PIC wafer after bonding the PIC wafer and the EIC wafer, such as back-grinding the PIC wafer.

In some embodiments, the method may include coupling optical fibers to the PIC on the PIC die. In some embodiments, the method may include forming V-grooves on the PIC wafer, where the V-grooves may be aligned with the PIC on the PIC wafer, and coupling the optical fibers to the PIC on the PIC die may include positioning the optical fibers in the V-grooves. The method may also include harnessing the optical fibers on the first PCB. In some embodiments, the method may include bonding a second PCB on top of the optical fibers and the first PCB.

In some embodiments, the method may include bonding a glass substrate having through glass vias (TGVs) to the die stack. The glass substrate may include bonding pads on one surface and contact pads on an opposite surface, where the bonding pads and contact pads may be connected by the TGVs. Bonding the glass substrate to the die stack may include coupling the contact pads to the PIC or the EIC, and wire-bonding the die stack to the first PCB may include wire-bonding the bonding pads to the first PCB.

In accordance with another example implementation, a device may include a silicon substrate, a die stack, and one or more printed circuit boards (PCBs) positioned on the silicon substrate. The die stack may including a first die and a second die bonded face-to-face by fusion bonding or hybrid bonding. The die stack may be fusion-bonded to the silicon substrate at an interface between the first die and the silicon substrate. A first surface of the second die opposite to an interface between the first die and the second die may include bonding pads, and the bonding pads may be bonded to the one or more PCBs through bonding wires.

In accordance with another example implementation, a device may include a die stack. The die stack may include a photonic integrated circuit die (PIC die) and an electronic integrated circuit die (EIC die). The PIC die may include a photonic integrated circuit (PIC), and the EIC die may include an electronic integrated circuit (EIC). The EIC die and the PIC die may be bonded face-to-face such that the PIC and the EIC face each other. The die stack may also include a first interconnect between the PIC and the EIC. A first end of the first interconnect may be disposed in the PIC die and coupled to a photodetector in the PIC and a second end of the first interconnect may be disposed in the EIC die and coupled to a logic circuit in the EIC. The die stack may also include a second interconnect between the PIC and the EIC. A first end of the second interconnect may be disposed in the EIC die and coupled to an output of the logic circuit and a second end of the second interconnect may be disposed in the PIC die and coupled to an optical switch in the PIC. The logic circuit may be configured to control the optical switch based on a detection of a single photon by the photodetector.

In some embodiments, the die stack may be disposed on a silicon substrate. In some embodiments, a surface of the PIC die may be fusion bonded to the silicon substrate. The first interconnect and the second interconnect may be metal interconnects. A bonded surface between the EIC die and the PIC die may be a fusion bonded surface.

Numerous benefits can be achieved by way of the present invention over conventional techniques. For example, techniques disclosed herein can be used to fabricate devices including one or more photonic integrated circuits, one or more electronic integrated circuits, and optical fibers in a same package with improved thermal and electrical performance. The techniques disclosed herein can minimize the thermal resistance at interfaces between components, improve overall thermal conductivity, minimize thermal gradient, and match coefficients of thermal expansion (CTEs), such that the package can allow the photonic circuits and electronic circuits to operate at cryogenic temperatures, such as below 10 K or below 5 K. In addition, the face-to-face bonding of the photonic integrated circuits and the electronic integrated circuits may reduce the delay and signal attenuation between the photonic integrated circuits and the electronic integrated circuits, and thus can improve the speed and power efficiency of the device. Furthermore, using TGVs on a glass substrate (rather than TSVs) for interconnections may leave more silicon areas for the EICs (or reduce the size of EIC die), reduce the processing steps for manufacturing the EIC die, and reduce the loss of the interconnections, and thus may reduce the cost of manufacturing the EIC die and improving the performance of the device.

BRIEF DESCRIPTION OF THE DRAWINGS

Aspects of the present disclosure are illustrated by way of example. Non-limiting and non-exhaustive aspects are described with reference to the following figures, wherein like reference numerals refer to like parts throughout the various figures unless otherwise specified.

FIG. 5A is a cross-sectional view of an example of a package including a printed circuit board (PCB) and a die stack bonded on a silicon handle wafer, where the die stack is wire-bonded to the PCB according to certain embodiments.

FIG. 5B is another cross-sectional view of an example of a package including a printed circuit board (PCB) and a die stack bonded on a silicon handle wafer, where optical fibers are coupled to the die stack and harnessed on the PCB according to certain embodiments.

DETAILED DESCRIPTION

Figure 1:
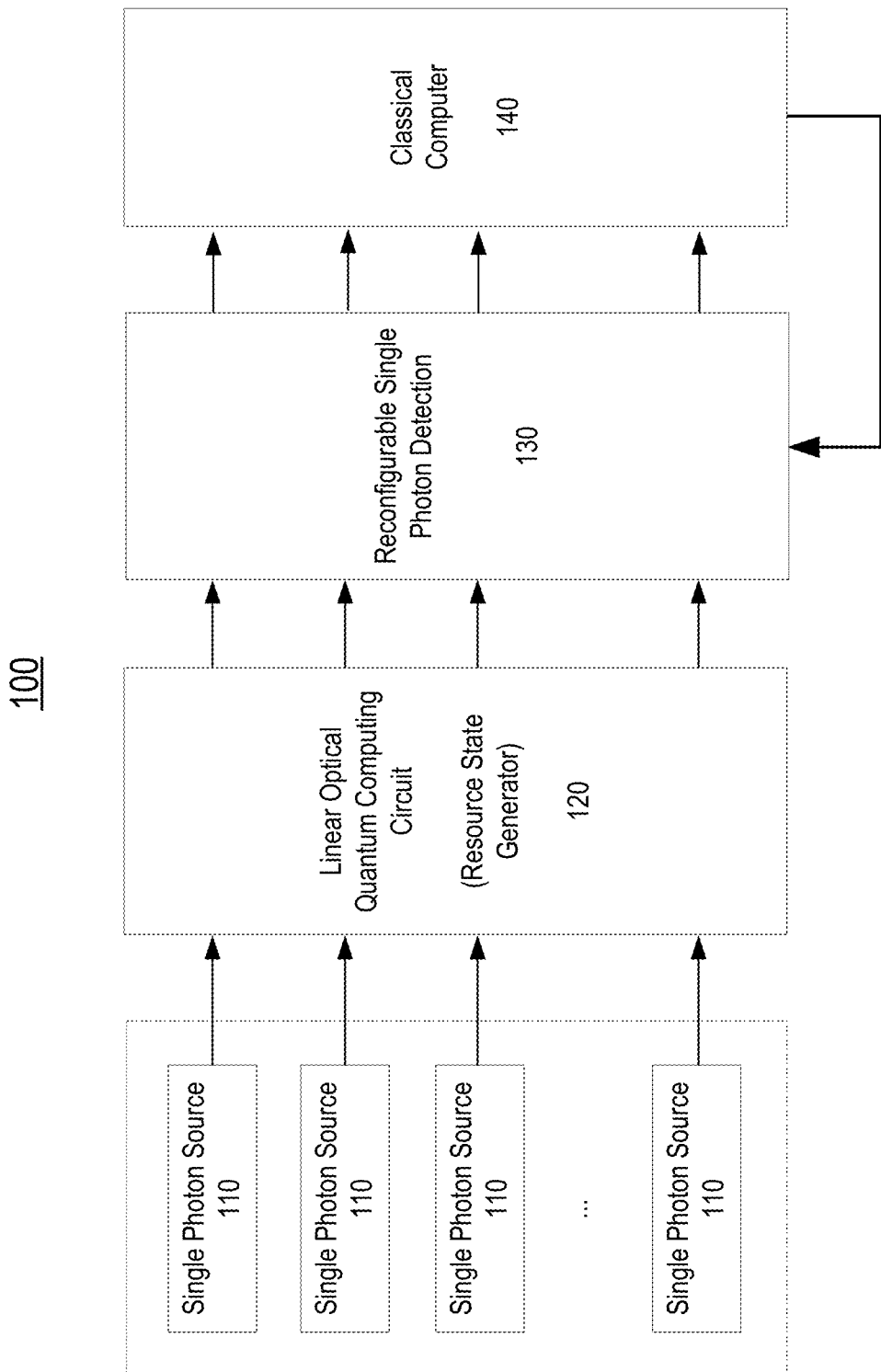
FIG. 1 is a simplified block diagram of an example of a linear optical quantum computer according to certain embodiments.

Techniques disclosed herein relate generally to assembling a device that includes both photonic integrated circuits and electronic integrated circuits in a package. In some embodiments, the device may include a photonic quantum computing processor. In one embodiment, the photonic integrated circuits and electronic integrated circuits are assembled into a same package that may also include optical and electrical cables, such as optical fibers and electrical ribbon cables. The thermal performance of the package may allow the packaged device to function at cryogenic temperatures. Various inventive embodiments are described herein, including methods, processes, systems, devices, and the like.

According to certain embodiments, a photonic integrated circuit (PIC) on a PIC wafer may be aligned with an electronic integrated circuit (EIC) on an EIC wafer, and the PIC wafer and the EIC wafer may then be bonded face-to-face using fusion bonding or hybrid bonding such that the PIC and EIC may face each other. The bonded PIC wafer and EIC wafer may be thinned (e.g., by back-grinding) and cut to singulate a plurality of die stacks each including a PIC die and an EIC die. One or more die stacks may be fusion-bonded to a silicon substrate. One or more printed circuit boards (PCBs) may also be physically bonded on the silicon substrate and wire-boned to the one or more die stacks. The one or more PCBs may be electrically connected to the PIC and EIC by bonding wires and through silicon vias (TSVs) or through glass vias (TGVs). Optical fibers may be coupled to the PICS, for example, using V-grooves formed on the PIC dies.

Techniques disclosed herein can be used to assemble one or more photonic circuits and one or more electronic circuits in a same package. The photonic circuits and electronic circuits may be stacked face-to-face (with the photonic circuits facing the electronic circuits) to reduce the length of the interconnects and the size of the package. The package can also accommodate optical and electrical connections between the photonic circuits and electronic circuits in the package and external circuits or system. Some examples of these optical and electrical connections may include optical fiber bundles and ribbon cables. The materials and bonding techniques used herein can also minimize the thermal resistance at the interfaces components, improve overall thermal conductivity, minimize thermal gradient, and match coefficients of thermal expansion (CTE), such that the package may allow the photonic circuits and electronic circuits to operate at cryogenic temperatures, such as below 10 K or below 5 K.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Quantum mechanics can have many advantages in encoding, transmission, and processing or information. For example, quantum key distribution may be used to achieve perfectly secure communication. Quantum metrology can be used to achieve precision measurements that could not be achieved without using quantum mechanics. In particular, a quantum computer based on quantum mechanics effects can offer exponentially faster computation or higher computation throughput. The systems based on quantum mechanics generally use both optical components and electrical circuits. Some other optical communication system or network technologies based on traditional processing units also use both optical components and electronic circuits. These systems generally include separate optical components and electronic circuits. In some systems, in order to reduce the cost and improve the performance, some optical components may be manufactured on semiconductor wafers, such as silicon wafers, to take advantages of the semiconductor processing technologies.

FIG. 1 is a simplified block diagram of an example of a linear optical quantum computer (LOQC) 100 according to certain embodiments. LOQC 100 may include multiple single photon sources 110, a linear optical quantum computing circuit 120, a reconfigurable single photon measurement circuit 130, and a classical computer 140. Each single photon source 110 may be configured to deterministically generate a sequence of single photons used as qubits. In some embodiments, single photon source 110 may include cascaded (or multiplexed) heralded photon sources based on, for example, spontaneous four wave mixing (SFWM) or spontaneous parametric down-conversion (SPDC) in passive nonlinear optical media. In each heralded photon source (HPS), photons may be non-deterministically produced in pairs (a signal photon and an idler photon), where one photon (e.g., signal photon) heralds the existence of the other photon (e.g., idler) in the pair. Thus, if a signal photon (herald photon) is detected at one heralded photon source, the corresponding idler photon can be used as the output of the single-photon source, while other heralded photon sources in the cascaded (or multiplexed) heralded photon sources of the single-photon source can be bypassed or switched off.

Linear optical quantum computing circuit 120 may include a network of waveguides, beam splitters, phase shifters, delay lines, and other photonic components and circuits. The photonic components and circuits may be used to implement optical controlled-NOT (CNOT) gates to generate Bell states, and may also be used to implement fusion gates to generate and/or to perform entangling measurements on larger entangled states that may be stored in the delay lines.

Reconfigurable single photon measurement circuit 130 may include a plurality of single photon detectors configured to measure single photons (qubits) in the entangled states to perform a fault tolerant quantum computation.

Classical computer 140 may decode the results of the measured photons by single photon measurement circuit 130 and perform some logic processing to generate the computation results. In some embodiments, classical computer 140 may feedback the decoding results to single photon measurement circuit 130. For example, based on the decoding results, classical computer 140 may adjust some measurement instructions or finalize some measurement instructions that are not pre-determined for use by single photon measurement circuit 130.

Linear optical quantum computer (LOQC) 100 may include millions of optical components, such as couplers, resonators, single photon detectors, beam splitters, interferometers, switches, phase shifters, and delay lines. Thus, it may be impractical to implement an LOQC using discrete optical components due to the sizes of these components and the cost to align and assemble these optical components. According to certain embodiments, these optical components may be fabricated as photonic integrated circuits (PICs) on a semiconductor wafer, such as silicon-photonic integrated circuits on a silicon wafer, using semiconductor processing technologies.

Linear optical quantum computer (LOQC) 100 may also include many electronic integrated circuits (EICs), including, for example, the control logic for the herald single photon sources, switches, etc. To achieve a high performance (e.g., high speed), the interconnects between the electronic circuits and the photonic integrated circuits may need to be minimized. In addition, many components of LOQC 100 may operate at cryogenic temperatures, such as below 10 K or below 5 K, in order to achieve the desired performance.

Techniques disclosed herein can be used to assemble one or more photonic integrated circuits (PICs) and one or more electronic integrated circuits (EICs) in a same package. The photonic circuits and electronic circuits may be bonded face-to-face (with the photonic circuits facing the electronic circuits) to reduce the length of the interconnects and the size of the package. The package can also accommodate optical and electrical connections between the photonic and electronic integrated circuits in the package and external circuits or systems. Some examples of these optical and electrical connections may include optical fiber bundles and ribbon cables. The materials and bonding techniques used herein can also minimize the thermal resistance at interfaces between components, improve overall thermal conductivity, minimize thermal gradient, and match coefficients of thermal expansion (CTEs), such that the package can allow the photonic circuits and electronic circuits to operate at cryogenic temperatures, such as below 10 K or below 5 K.

Figure 2:
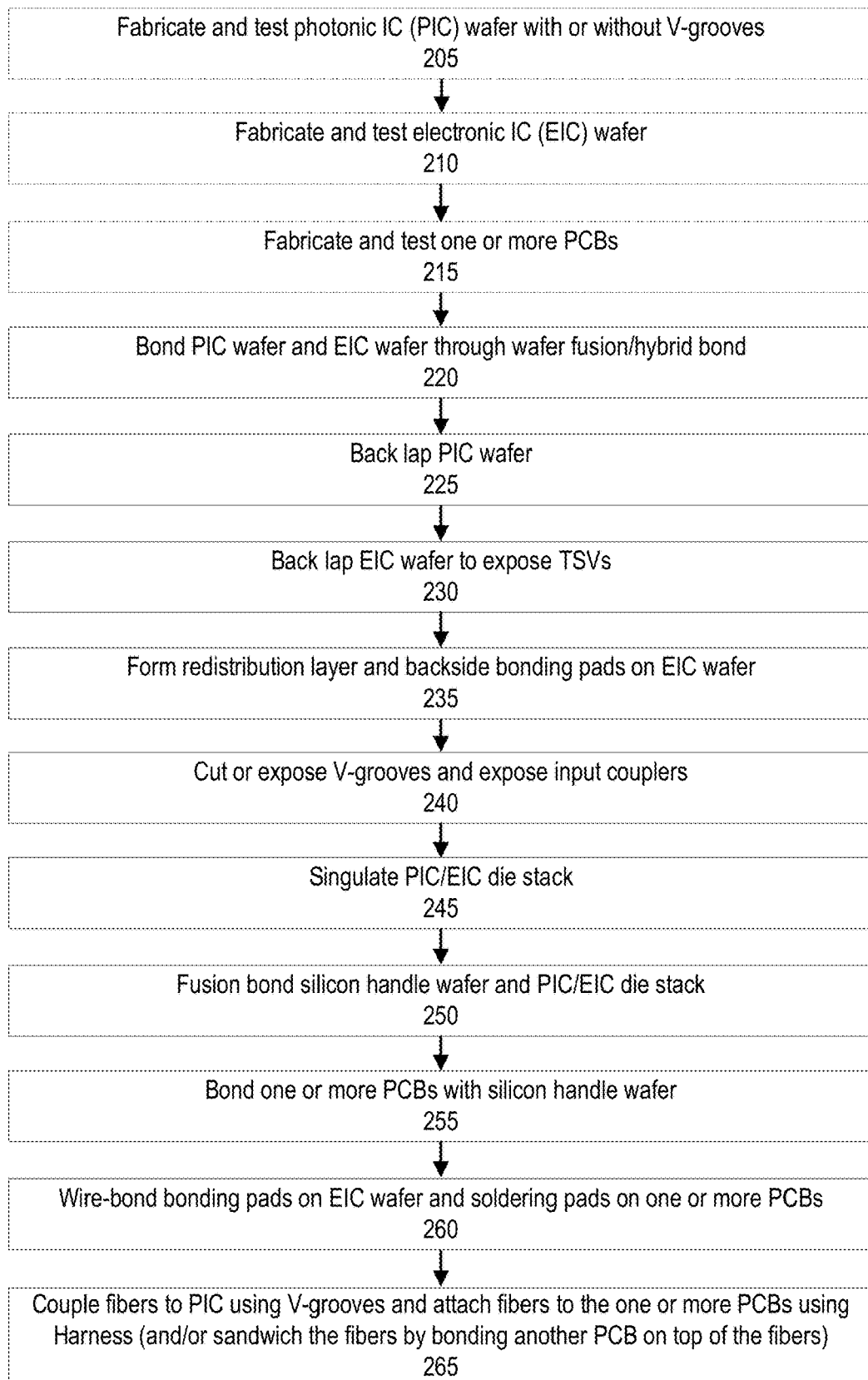
FIG. 2 is a flow chart illustrating an example of a process for integrating photonic integrated circuits and electronic circuits in a same package according to certain embodiments.
Figure 3A:
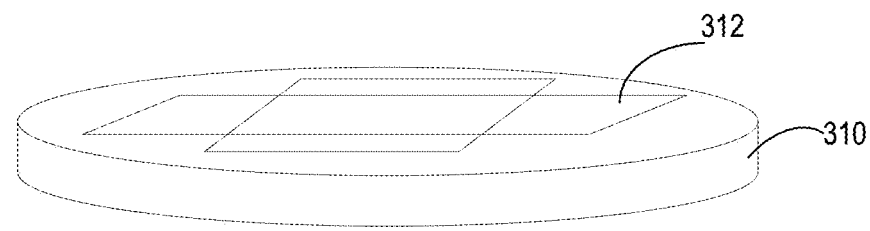
FIG. 3A illustrates an example of a silicon wafer with photonic integrated circuits (with or without V-grooves) fabricated thereon according to certain embodiments.

FIG. 2 is a flow chart illustrating an example of a process 200 for integrating photonic integrated circuits and electronic integrated circuits in a same package according to certain embodiments. Process 200 may include, at block 205, fabricating photonic integrated circuits on semiconductor wafers, such as silicon wafers, using semiconductor processing equipment and technology. Operations at block 205 may also include testing the photonic integrated circuits on the semiconductor wafers. For example, in some embodiments, additional couplers (e.g., grating couplers) may be manufactured on the semiconductor wafer and may be used as optical test ports for coupling light into or out of the photonic integrated circuits during testing. The additional couplers may be removed at a later stage of process 200 described below. The PICs need to be tested to exclude defected circuits before assembly because it may be more costly to find and reject the defected assembled devices that may include other properly functioning components. In some embodiments, V-grooves for aligning and coupling optical fibers with waveguides in the PICs may also be fabricated on the semiconductor wafer. FIG. 3A illustrates an example of a silicon wafer 310 with photonic integrated circuits 312 fabricated thereon (with or without the V-grooves) according to certain embodiments.

Figure 3B:
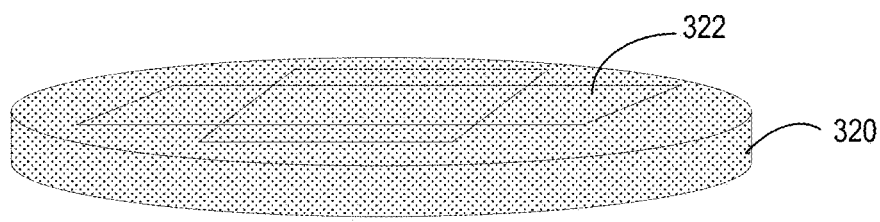
FIG. 3B illustrates an example of a silicon wafer with electrical integrated circuits fabricated thereon according to certain embodiments.

At block 210, electronic integrated circuits may be fabricated on semiconductor wafers, such as silicon wafers, using semiconductor processing equipment and technology. The manufactured integrated circuits on the electronic integrated circuit wafer may be tested to reject defected circuits before assembling with the PICs. FIG. 3B illustrates an example of a silicon wafer 320 with electrical integrated circuits 322 fabricated on silicon wafer 320 according to certain embodiments.

At block 215, printed circuit boards (PCBs) may be fabricated and tested. The PCBs may be used to provide connections to external system, to provide power distribution network (e.g., power layers and ground layers), and to include some electronic components, such as voltage regulators and decoupling capacitors in the package. The PCBs may also include, for example, electrical cable connection ports, such as ribbon cable connectors, RF/microwave connectors (e.g., SMA connectors), etc. In some embodiments, the PCBs may also include fiber cable harnesses and/or electric cable harnesses. In some embodiments, the PCBs may be made of a ceramic material, silicon, CTE-matched silicon dioxide, or an organic material (e.g., resin). In various embodiments, one or more PCB boards may be used in a package. For example, one PCB board may be below the fiber cable and another PCB board may be above the fiber cable to sandwich the fiber cable. This may allow for easier attachment and more secure and reliable integration of the fiber cable with the PICs.

Figure 3C:
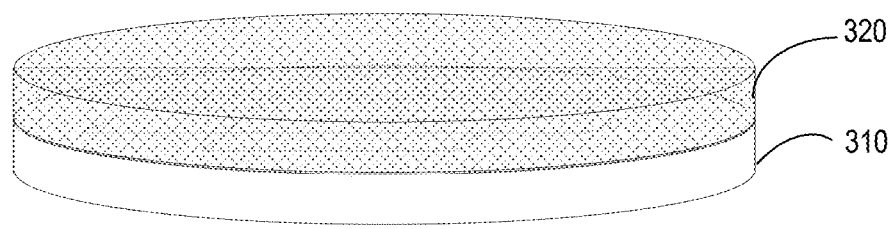
FIG. 3C illustrates an example of a wafer stack including a silicon wafer with photonic integrated circuits fabricated thereon and a silicon wafer with electrical integrated circuits fabricated thereon according to certain embodiments.

At block 220, a PIC wafer manufactured and tested at block 205 and an EIC wafer manufactured and tested at block 210 may be aligned and bonded through wafer-to-wafer fusion or hybrid bond to form a wafer stack. Wafer-to-wafer fusion bonding may bond two wafers without any intermediate layers and is based on chemical bonds between the surfaces of two wafers that meet certain conditions. For example, fusion bonding may be used to bond two silicon wafers. Wafer-to-wafer fusion bonding may include wafer cleaning and other preprocessing, aligning and pre-bonding at room temperature, and annealing at elevated temperatures, such as about 250° C. or higher. Fusion bonding can significantly reduce or substantially eliminate the thermal resistance at the interface between two wafers. In some embodiments, wafer-level metal/adhesive hybrid bonding may be used to bond two wafers with dielectric materials (e.g., oxide) and/or metal at the surface of one or both wafers. Dielectric bonds and/or metal bonds may be formed at the interface between two wafers. Hybrid bonding may include, for example, wafer cleaning, surface activation (e.g., plasma activation), pre-bounding, and annealing at, for example, 250-300 ° C. or higher. FIG. 3C illustrates an example of a wafer stack including silicon wafer 310 with photonic integrated circuits fabricated thereon and silicon wafer 320 with electrical integrated circuits fabricated thereon.

Figure 3D:
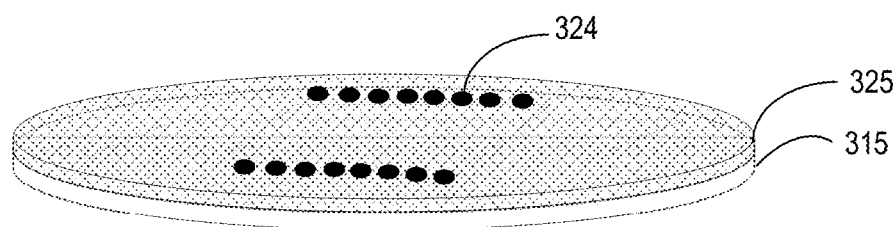
FIG. 3D illustrates an example of a wafer stack including two bonded silicon wafers after back lapping (or back grinding) and bonding pad formation according to certain embodiments.

At blocks 225 and 230, the PIC wafer and the EIC wafer may be back-grinded (or back lapped) to make the wafer stack including the PIC wafer and EIC wafer thinner. For example, the PIC wafer may be back lapped from about 775 microns to about 100-600 microns. The EIC wafer may be back grinded from about 775 microns to about 50 microns or until through-silicon vias (TSVs) are exposed. At block 235, one or more redistribution layers (RDLs) may be formed on the backside of the EIC wafer, and bonding pads may be formed on the redistribution layer. The bonding pads may be used to make connections with the EIC from PCBs. FIG. 3D illustrates an example of a wafer stack including two bonded silicon wafers 315 and 325 after back lapping (or back grinding) and bonding pad formation according to certain embodiments. Bonding pads 324 may be formed on the back side of back-grinded silicon wafer 325 according to a desired pattern.

Figure 4A:
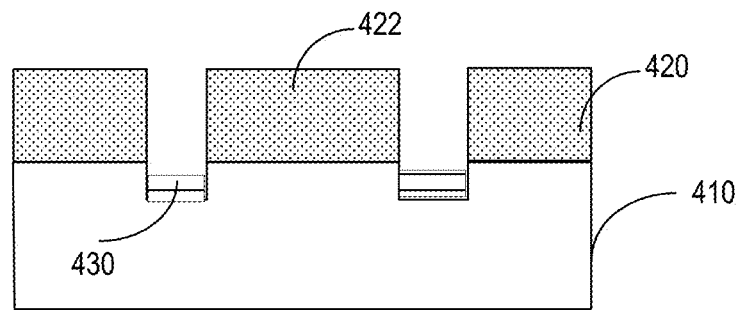
FIG. 4A illustrates an example of a stack of two bonded silicon wafers after a process that cuts or exposes V-grooves on the silicon wafer with photonic integrated circuits fabricated thereon according to certain embodiments.

At block 240, the EIC wafer and the PIC wafer may be etched to cut through portions of the thinned EIC wafer and form V-grooves on the PIC wafer. The V-grooves may be used to align and couple optical fibers with waveguides in the PIC. In some embodiments, the V-grooves may be formed before bonding the PIC wafer with the EIC wafer. In some embodiments where the optical test ports are fabricated on the PIC wafer for testing the PIC wafer, the optical test ports may also be removed by the etching, and the input ports (e.g., edge couplers) to the waveguides may be exposed. FIG. 4A illustrates an example of a wafer stack including two bonded silicon wafers 410 and 420 after a process that cuts V-grooves 430 on the silicon wafer 410 with photonic integrated circuits fabricated thereon according to certain embodiments, where the V-grooves are not fabricated on silicon wafer 410 as a part of the PIC fabrication process described above with respect to block 205. If V-grooves are fabricated on silicon wafer 410 as a part of the PIC fabrication process described above, portions of silicon wafer 420 may be cut through to expose the V-grooves on silicon wafer 410. Silicon wafer 420 may be cut into several EIC dies 422, which may include bonding pads on the backside (not shown in FIG. 4A).

Figure 4B:
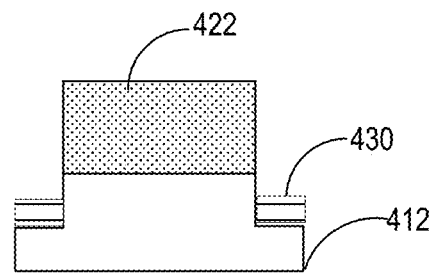
FIG. 4B illustrates an example of a singulated die stack including a photonic integrated circuit (PIC) die and an electronic integrated circuit (EIC) die according to certain embodiments.

At block 245, the wafer stack including the PIC wafer and the EIC wafer may be cut by, for example, laser or plasma scribing or grinding, to separate each die area that includes a PIC die and an EIC die. The cutting may be performed at areas where the V-grooves are formed at described above with respect to block 240. FIG. 4B illustrates an example of a singulated die stack including a photonic integrated circuit (PIC) die 412 and an EIC die 422 according to certain embodiments.

Figure 4C:
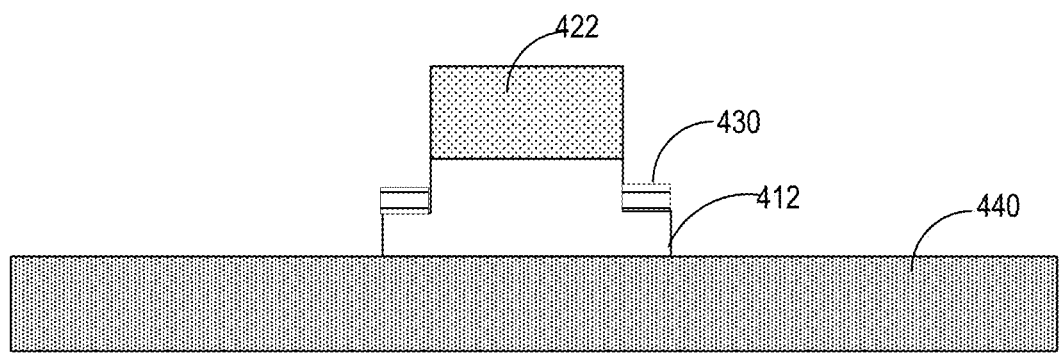
FIG. 4C illustrates an example of a singulated die stack including a PIC die and an EIC die and bonded on a silicon handle wafer according to certain embodiments.

At block 250, a semiconductor wafer, such as a silicon handle wafer, may be bonded with the backside of the PIC die though, for example, fusion bonding as described above. Thus, a stack including the silicon handle wafer, the PIC die, and the EIC die may all include a silicon substrate and may be bonded to form chemical bonds at the interfaces between adjacent substrates. Therefore, the CTEs of the three substrates may be matched and the total thermal resistance from the EIC die to the silicon handle wafer may be relative low because high thermal resistance at the interfaces is eliminated. FIG. 4C illustrates an example of a singulated die stack including PIC die 412 and EIC die 422 and bonded on a silicon handle wafer 440 according to certain embodiments.

Figure 4D:
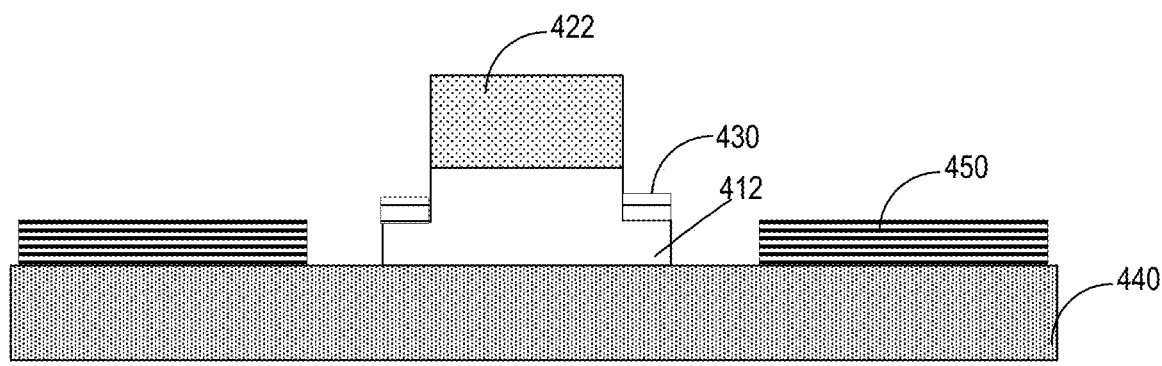
FIG. 4D illustrates an example of a package including a printed circuit board (PCB) and a die stack bonded on a silicon handle wafer according to certain embodiments.

At block 255, the PCB manufactured and tested at block 215 may be cut (if needed), aligned, and attached to the silicon handle wafer at areas where no PIC-EIC die stacks are bonded. The bonding method may depend on the material of the PCBs. For example, if silicon is used for the PCBs, fusion bonding techniques may be used. If oxides, such as silicon dioxide, are used for the PCBs, a hybrid bonding technique may be used. If other materials are used for the PCBs, an epoxy or an adhesive may be used to attach the PCBs to the silicon handle wafer. FIG. 4D illustrates an example of a package including a single printed circuit board (PCB) 450 and a die stack including PIC die 412 and EIC die 422 bonded on silicon handle wafer 440 according to certain embodiments. As described above, in some embodiments, multiple PCB boards may be used in the same package and may be arranged at different horizontal or vertical locations. For example, in some embodiments, one PCB may be positioned on each sides of the die stack. In some embodiments, two or more PCB boards may be positioned vertically with one on top of another.

At block 260, the bonding pads on EIC die and the solder pads on PCB may be connected using bonding wires. At block 265, optical fibers may be attached to the PIC die and the PCB. For example, the optical fibers may be attached to the V-grooves on the PIC die and attached to the PCB through fiber harnesses. In some embodiments, more than 100 optical fibers or more than 200 optical fiber may be attached to each of two sides of the PIC die. In some embodiments, an additional PCB board may be placed above the optical fibers and PCB board 450 such that the optical fibers may be sandwiched by the two PCB boards. This may allow for easier attachment and more secure and reliable integration of the optical fibers with PIC die 412.

FIG. 5A is a cross-sectional view of an example of a package 500 including a printed circuit board (PCB) 540 and a die stack including a PIC die 520 and an EIC die 530 bonded on a silicon handle wafer 510 according to certain embodiments. PCB 540 may include various electronic components soldered on it, such as decoupling capacitors 542 or cable connectors for ribbon cables or RF/microwave cables. FIG. 5A shows that bonding pads 532 on backside of EIC die 530 are connected to bonding pad 546 on PCB 540 through bonding wire 544.

FIG. 5B is another cross-sectional view of package 500 including printed circuit board (PCB) 540 and a die stack including PIC die 520 and EIC die 530 bonded on silicon handle wafer 510, where optical fibers 550 are coupled to PIC die 520 and attached to PCB 540 through a harness 552 according to certain embodiments. Optical fiber 550 may fit in the V-grooves on PIC die 520 and may be aligned with waveguides on PIC die 520 by the V-grooves on PIC die 520. Optical fiber 550 may be coupled to the waveguides through, for example, edge couplers as described above.

Figure 6:
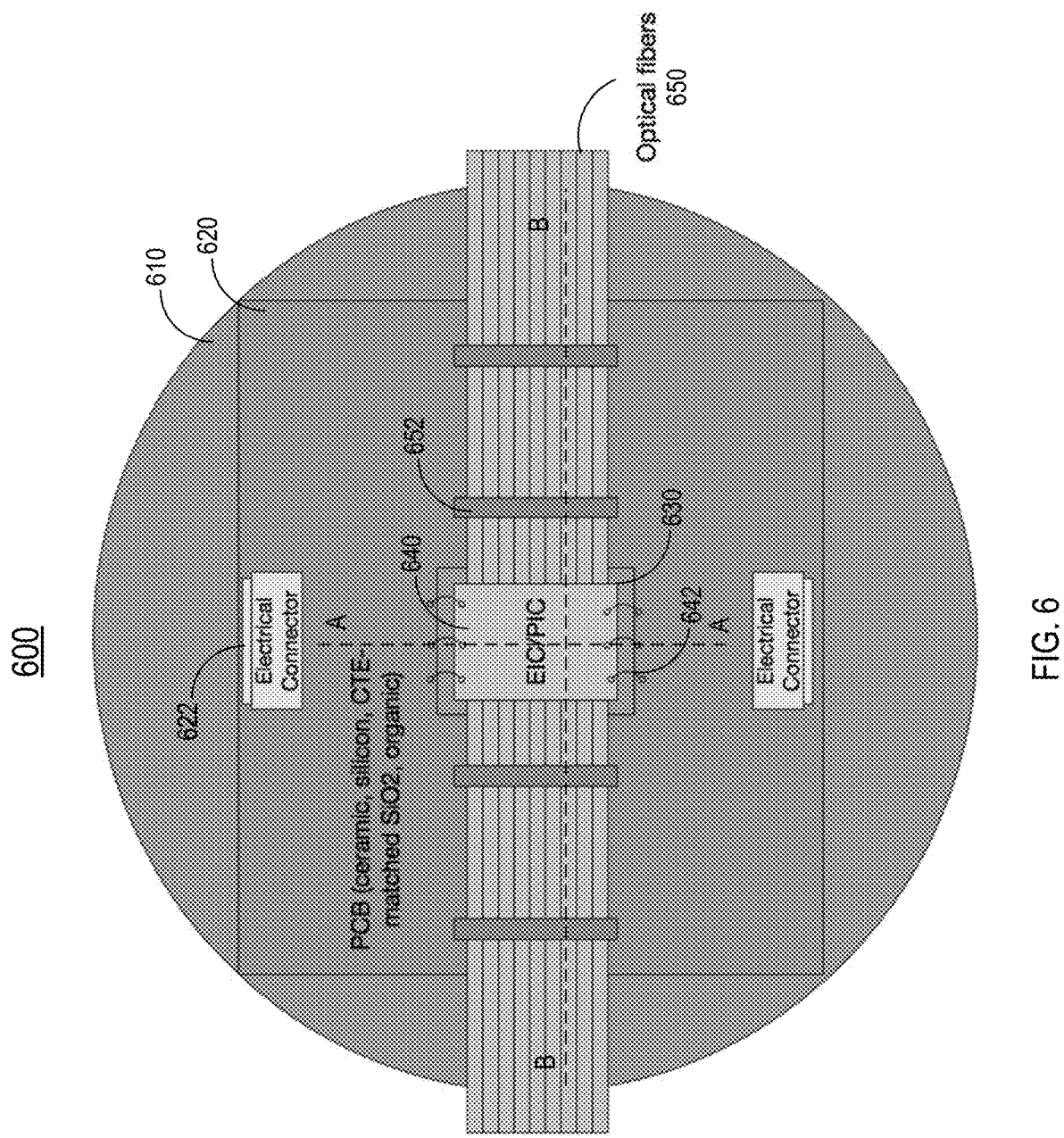
FIG. 6 is a top view of an example of a package that includes a PIC, an EIC, a PCB, electrical connectors, and optical fibers on a silicon handle wafer according to certain embodiments.

FIG. 6 is a top view of an example of a package 600 that includes a PIC die 630, an EIC die 640, a PCB 620, one or more electrical connectors 622, and optical fibers 650 on a silicon handle wafer 610. Even though FIG. 6 only shows one PIC/EIC die stack, many PIC/EIC die stacks can be formed by bonding two wafers as shown in FIG. 4A. As illustrated, a PCB 620 is attached to silicon handle wafer 610, e.g., using an epoxy or through fusion bonding or hybrid bonding, depending on the material of PCB 620. As described above, one or more PCBs 620 may be attached to silicon handle wafer 610 at different horizontal or vertical locations. A PIC/EIC die stack includes EIC die 640 bonded face-to-face with PIC die 630 (e.g., by fusion bonding or hybrid bonding) such that the PICs may directly face the EICs. The PIC/EIC die stack may be bonded to silicon handle wafer 610 by, for example, fusion bonding. EIC die 640 may be electrically connected to PCB 620 through bonding wires 642, where the bonding pads and bonding wires may only be at top (north) and bottom (south) sides of the PIC/EIC die stack. The left (west) and right (east) sides of the PIC/EIC die stack may be coupled with optical fibers 650, where optical fibers 650 may be attached to PCB 620 through harnesses 652. PCB 620 may also include electrical connectors 622 and some other electronic components, such as voltage regulators, power management ICs, decoupling capacitors, etc.

Figure 7:
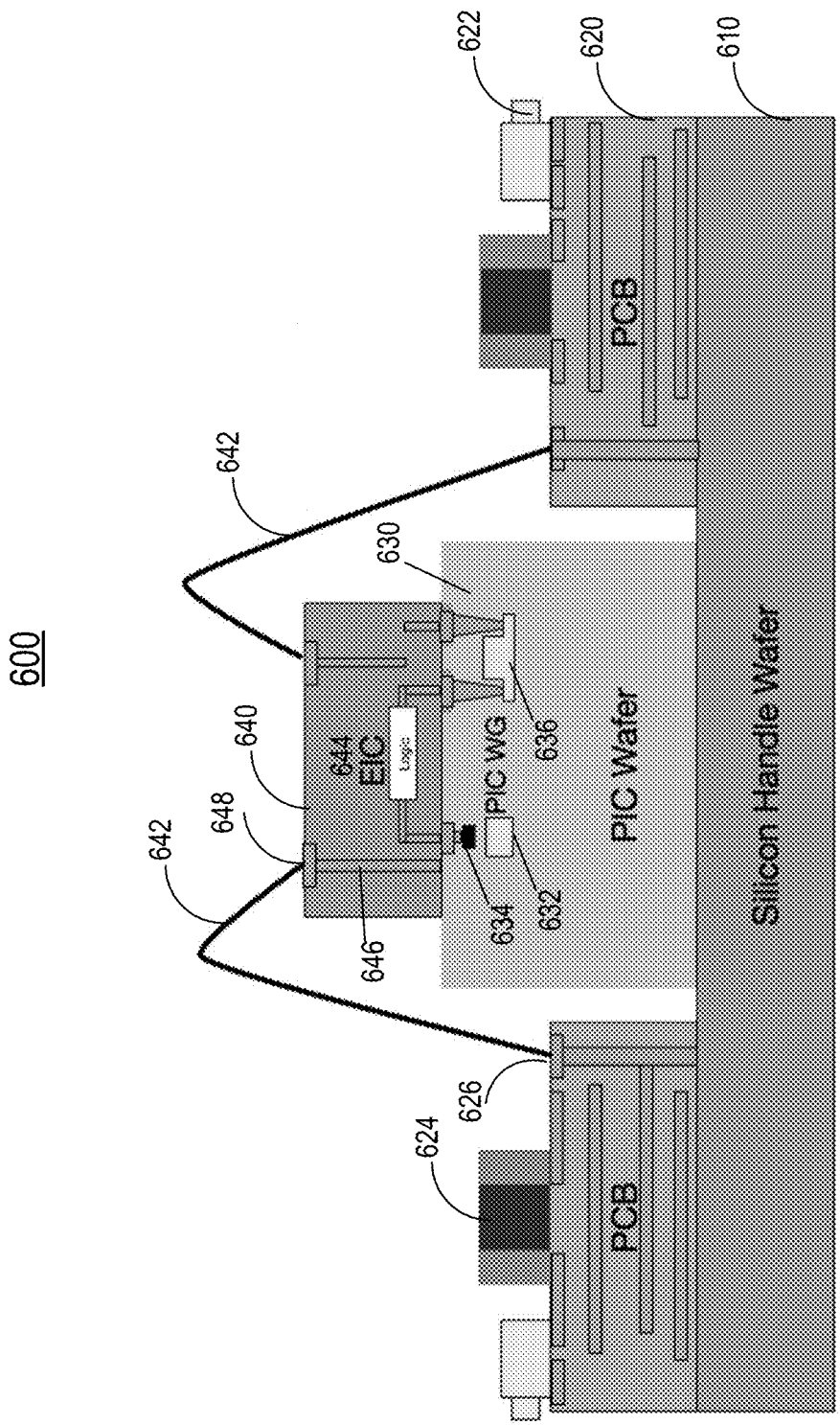
FIG. 7 is cross-sectional view of the example package shown in FIG. 6 according to certain embodiments.

FIG. 7 is a cross-sectional view of example package 600 along line A-A shown in FIG. 6 according to certain embodiments. FIG. 7 shows that PCB 620 and the PIC/EIC die stack are bonded to a top surface of silicon handle wafer 610. PCB 620 may include multiple layers of interconnect traces or planes connected through vias. Electronic components, such as connector 622 and decoupling capacitors 624 may be soldered on the top surface of PCB 620. PCB 620 may also include solder pads 626 on the top surface of PCB 620. The PIC/EIC die stack may include PIC die 630 and EIC die 640 bonded face-to-face with each other such that the PICS and EICs may directly face each other and the connections can be short. PIC die 630 may include waveguides 632 and 636, and photodetectors 634. EIC die 640 may include some through-silicon vias (TSVs) 646 and control logic circuits 644. A photodetector 634 (e.g., a single photon detector) may detect a single photon from waveguide 632, and send the detection result to control logic circuit 644, which may determine whether and how to tune waveguide 636 (e.g., to turn on or off an optical switch). EIC die 640 may include redistribution layers (RDL) and bonding pads 648 on the top side (back side) of the die. Bonding pads 648 may be connected to control logic circuits 644 through TSVs, and may also be connected to solder pads 626 on PCB 620 through bonding wires 642.

Figure 8:
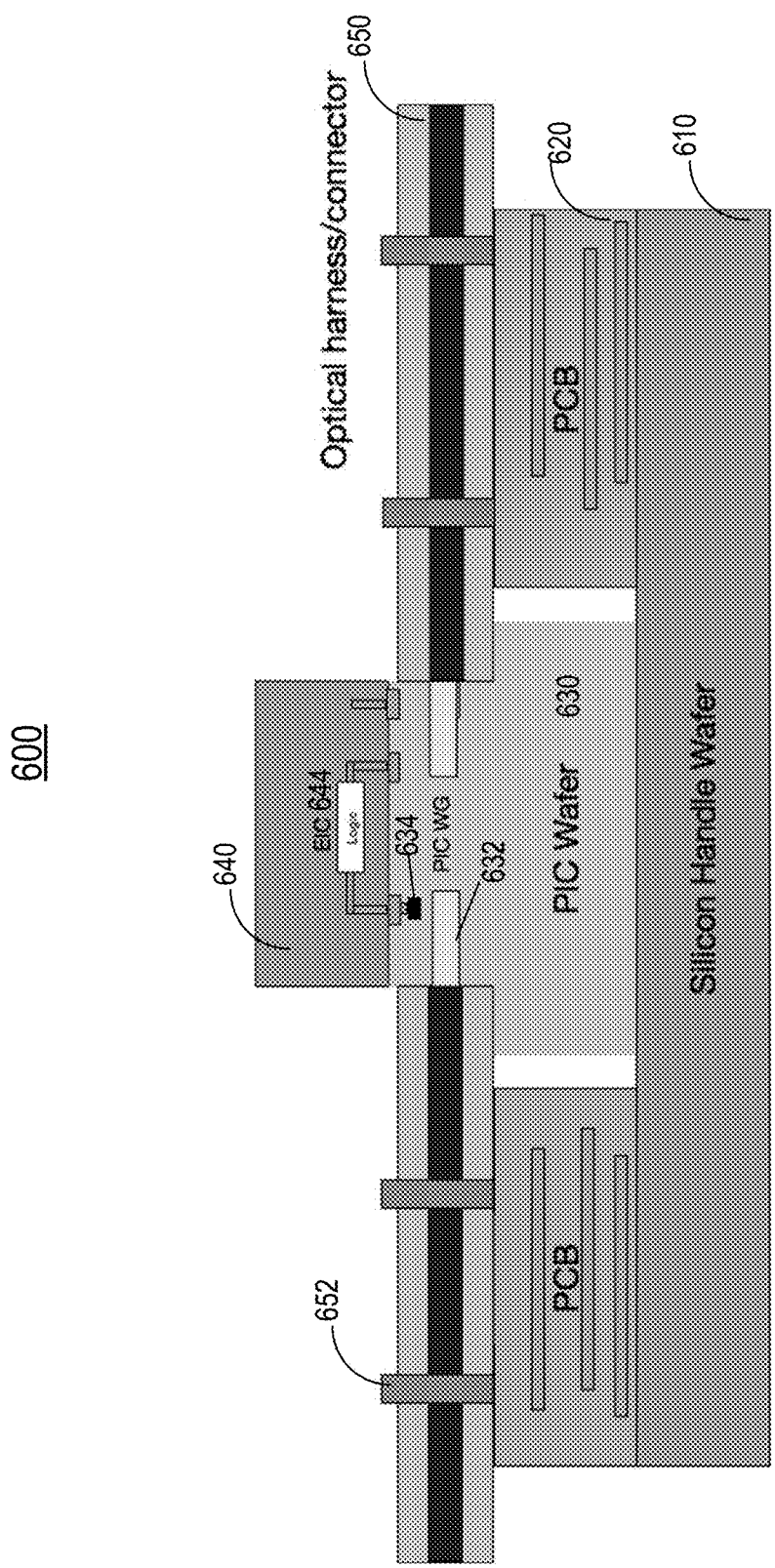
FIG. 8 is another across-sectional view of the example package shown in FIG. 6 according to certain embodiments.

FIG. 8 is another cross-sectional view of example package 600 along line B-B shown in FIG. 6 according to certain embodiments. FIG. 8 shows that, in the B-B direction, optical fibers 650 may be attached to PCB 620 through harnesses 652. Optical fibers 650 may fit in V-grooves formed on PIC die 630, where the V-grooves may align with the waveguides on PIC die 630. Therefore, when assembled, the cores of optical fibers may align with corresponding cores of the waveguides on PIC die 630.

Figure 9:
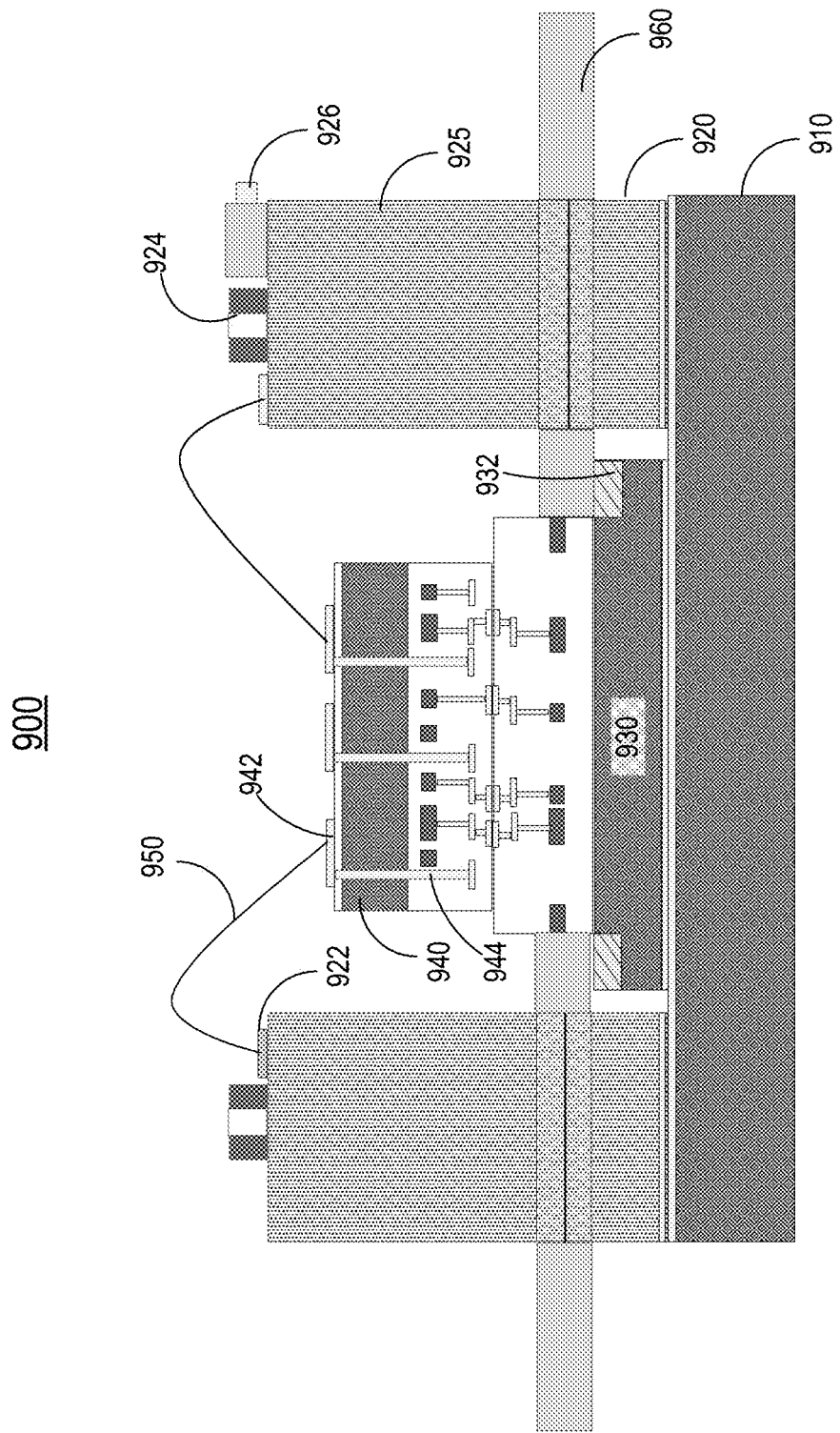
FIG. 9 is a cross-sectional view of an example package according to certain embodiments.

FIG. 9 is a cross-sectional view of an example package 900 according to certain embodiments. Package 900 may include a PIC die 930, an EIC die 940, and a PCB 920 on a silicon handle wafer 910. Even though FIG. 9 only shows one PIC/EIC die stack, many PIC/EIC die stacks can be formed by bonding two wafers as shown in FIG. 4A. As illustrated, PCB 920 may be attached to silicon handle wafer 910, e.g., using an epoxy or through fusion bonding or hybrid bonding, where the bonding method may depend on the material of PCB 920. As described above, one or more PCBs may be attached to silicon handle wafer 910 at different horizontal or vertical locations. For example, a second PCB 925 may be bonded on top of PCB 920. PCB 920 may also include electrical connectors 926 and some other electronic components, such as voltage regulators, power management ICs, decoupling capacitors 924, etc.

A PIC/EIC die stack may include EIC die 940 bonded face-to-face with PIC die 930 (e.g., by fusion bonding or hybrid bonding) such that the PICs may directly face the EICs. The PIC/EIC die stack may be bonded to silicon handle wafer 910 by, for example, fusion bonding. EIC die 940 may include bonding pads 942 on the back side of EIC die 940, where bonding pads 942 may be connected to the EICs on EIC die 940 through TSVs 944 as described above with respect to, for example, FIG. 7. EIC die 940 may be electrically connected to PCB 920 by bonding wires 950 which may connect bonding pads 922 on PCB 925 and bonding pads 942 on the back side of EIC die 940.

Optical fibers 960 may be attached to PCB 920 and may fit in V-grooves 932 formed on PIC die 930. V-grooves 932 may align with the waveguides on PIC die 930. Therefore, when assembled, the cores of optical fibers 960 may align with corresponding cores of the waveguides on PIC die 930. As shown in FIG. 9, optical fibers 960 may be sandwiched between and secured by PCB 920 and PCB 925. For example, optical fibers 960 may first be attached to PCB 920 and fit in V-grooves 932 to align with waveguides on PIC dies 930, and PCB 925 may then be bonded on top of PCB 920 and optical fibers 960 to secure optical fibers 960.

Figure 10:
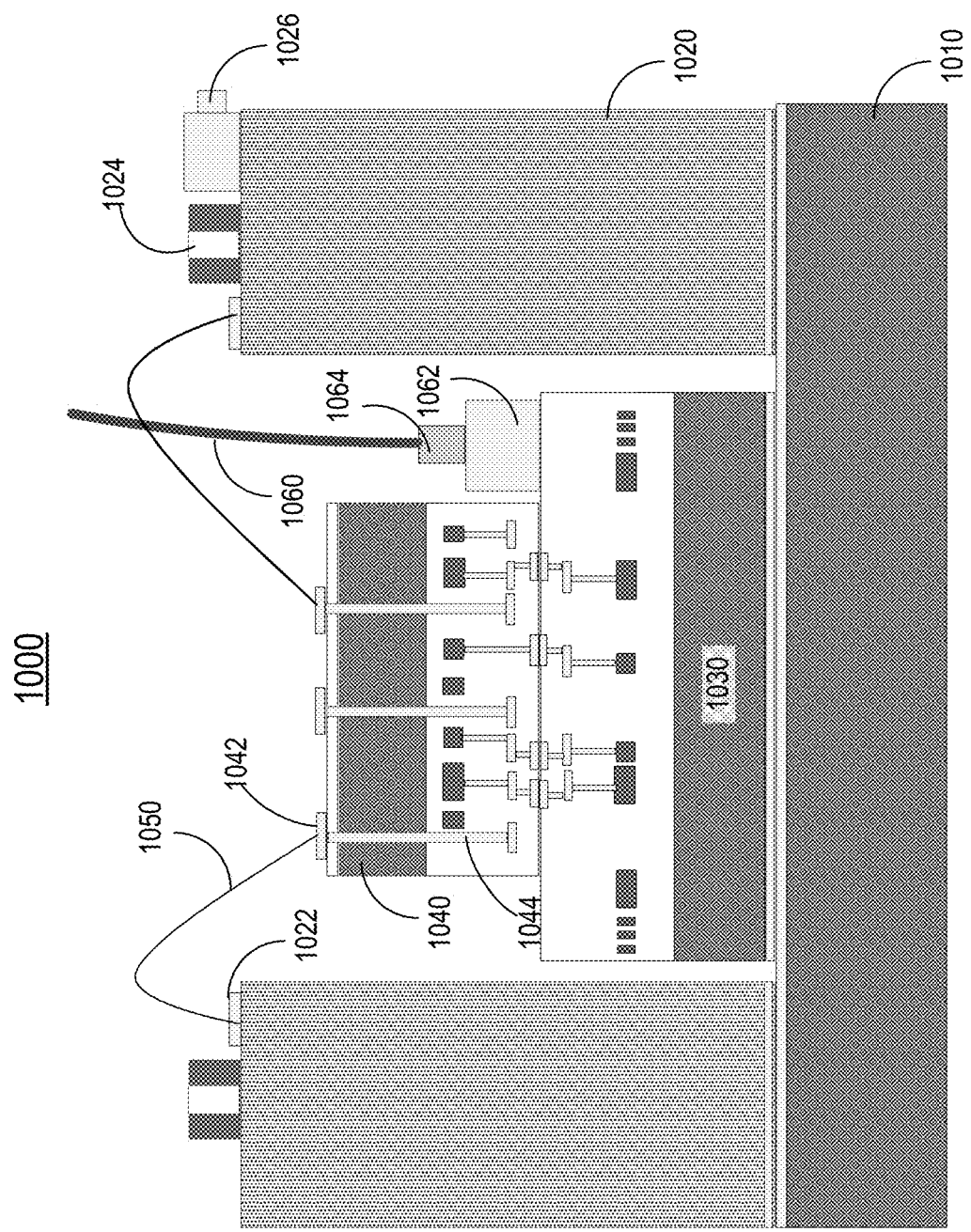
FIG. 10 is a cross-sectional view of an example package according to certain embodiments.

FIG. 10 is a cross-sectional view of an example package 1000 according to certain embodiments. Package 1000 may include a PIC die 1030, an EIC die 1040, and a PCB 1020 on a silicon handle wafer 1010. Even though FIG. 10 only shows one PIC/EIC die stack, many PIC/EIC die stacks can be formed by bonding two wafers as shown in FIG. 4A. As illustrated, PCB 1020 may be attached to silicon handle wafer 1010, e.g., using an epoxy or through fusion bonding or hybrid bonding, where the bonding method may depend on the material of PCB 1020. PCB 1020 may have a height or thickness less than, equal to, or greater than the height or thickness of a PIC/EIC die stack that includes EIC die 1040 bonded with PIC die 1030. PCB 1020 may include electrical connectors 1026 and some other electronic components, such as voltage regulators, power management ICs, decoupling capacitors 1024, bonding pads 1022, etc.

EIC die 1040 may be bonded face-to-face with PIC die 1030 (e.g., by fusion bonding or hybrid bonding) such that the PICs may directly face the EICs to reduce the length the interconnects between the PICs and the EICs. The PIC/EIC die stack may be bonded to silicon handle wafer 1010 by, for example, fusion bonding. EIC die 1040 may include bonding pads 1042 on the back side of EIC die 1040, where bonding pads 1042 may be connected to the EICs on EIC die 1040 through TSVs 1044 as described above with respect to, for example, FIG. 7. EIC die 1040 may be electrically connected to PCB 1020 by bonding wires 1050, which may connect bonding pads 1022 on PCB 1020 and bonding pads 1042 on the back side of EIC die 1040.

As shown in FIG. 10, optical fibers 1060 may be vertically coupled to the PICs on PIC die 1030 by one or more couplers 1062. Couplers 1062 may be bonded to PIC die 1030 and aligned with the waveguides on PIC die 1030. Optical fibers 1060 may each include a collimation lens 1064 (e.g., a GRIN lens or a micro-lens) on one end, and may be coupled to couplers 1062 for coupling light from optical fibers 1060 into the waveguides on PIC die 1030.

Figure 11:
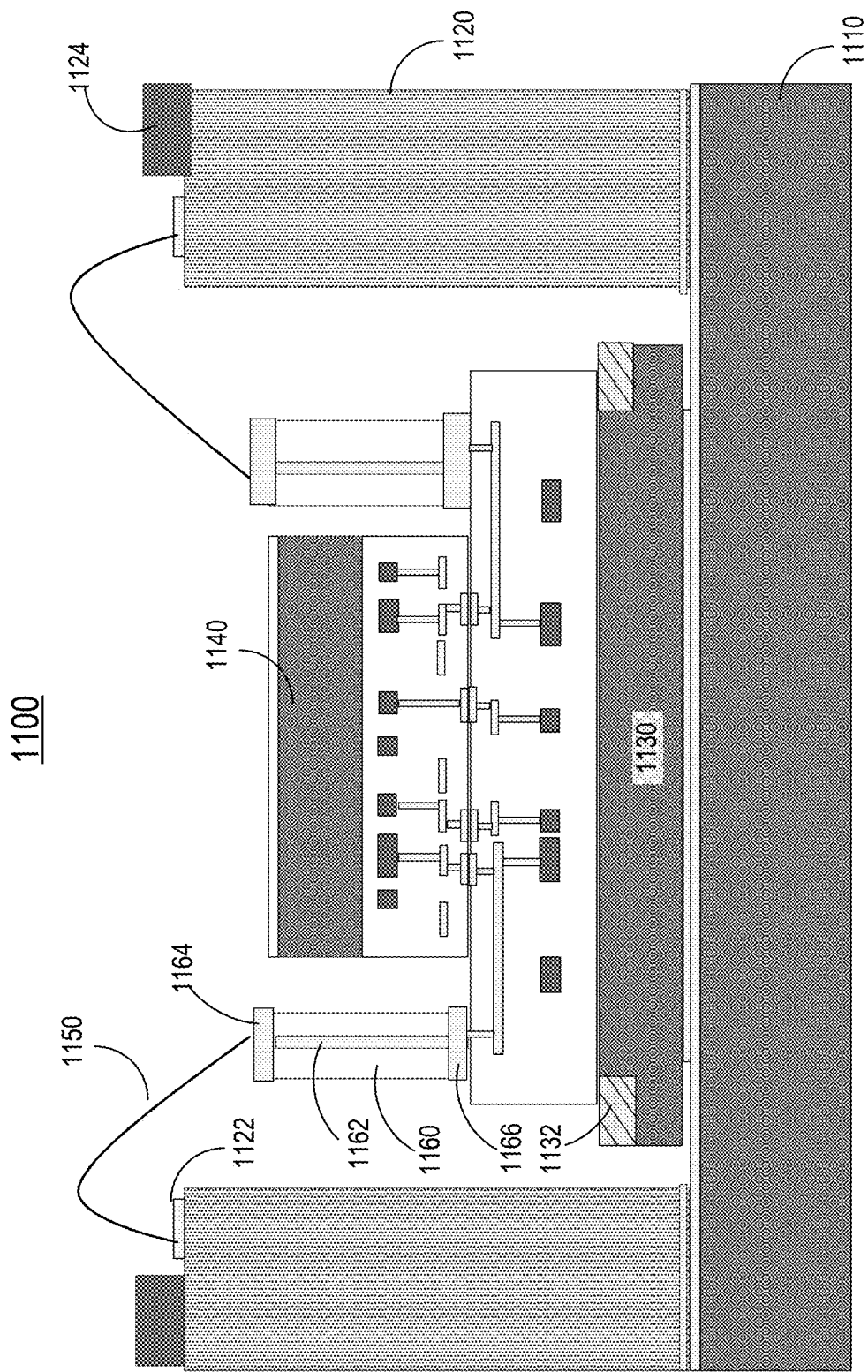
FIG. 11 is a cross-sectional view of an example package according to certain embodiments.

FIG. 11 is a cross-sectional view of an example package 1100 according to certain embodiments. Package 1100 may include a PIC die 1130, an EIC die 1140, and a PCB 1120 on a silicon handle wafer 1110. Even though FIG. 11 only shows one PIC/EIC die stack, many PIC/EIC die stacks can be formed by bonding two wafers as shown in FIG. 4A. As illustrated, PCB 1120 is attached to silicon handle wafer 1110, e.g., using an epoxy or through fusion bonding or hybrid bonding. As described above, one or more PCBs may be attached to silicon handle wafer 1110 at different horizontal or vertical locations. For example, PCB 1120 may include two or more PCBs bonded vertically as described above with respect to, for example, FIG. 9. PCB 1120 may also include some electronic components, such as voltage regulators, power management ICs, decoupling capacitors 1124, connectors, etc.

A PIC/EIC die stack may include EIC die 1140 bonded face-to-face with PIC die 1130 (e.g., by fusion bonding or hybrid bonding) such that the PICs may directly face the EICs. As described above, the PIC/EIC die stack may be bonded to silicon handle wafer 1110 by, for example, fusion bonding. EIC die 1140 may not include TSVs or bonding pads on the back side. Rather, a glass substrate 1160 with through glass vias (TGVs) 1162 may be bonded to PIC die 1130. Contact pads 1166 on one side of glass substrate 1160 may be coupled to bonding pads 1164 on the other side of glass substrate 1160 through TGVs 1162. Contact pads 1166 may be coupled to the PICs on PIC die 1130 and/or the EICs on EIC die 1140. Bonding pads 1164 may be electrically connected to bonding pads 1122 on PCB 1120 by bonding wires 1150. Using TGVs instead of TSVs may leave more silicon areas for the EICs, thus reducing the size of EIC dies 1040. In addition, without TSVs on EIC die 1140, the processing steps for manufacturing the EIC die 1140 may be significantly reduced, and thus may further reduce the cost of manufacturing the EIC die 1140. Furthermore, glass (e.g., silicon dioxide) may be a much better insulator than silicon, and thus the TGVs may have much lower RC losses than TSVs.

Optical fibers may be attached to PCB 1120 and may fit in V-grooves 1132 formed on PIC die 1130. V-grooves 1132 may align with the waveguides on PIC die 1130. Therefore, when assembled, the cores of the optical fibers in V-grooves 1132 may align with corresponding cores of the waveguides on PIC die 1130. As described above with respect to FIG. 9, the optical fibers may be sandwiched between and secured by PCB 1120.

The above described techniques can be used to assemble or package other circuits for the desired thermal and electrical performance. For example, the techniques can also be used to package one or more silicon ICs on silicon-based package substrate, or package one or more ICs on non-silicon package substrates.

Figure 12A:
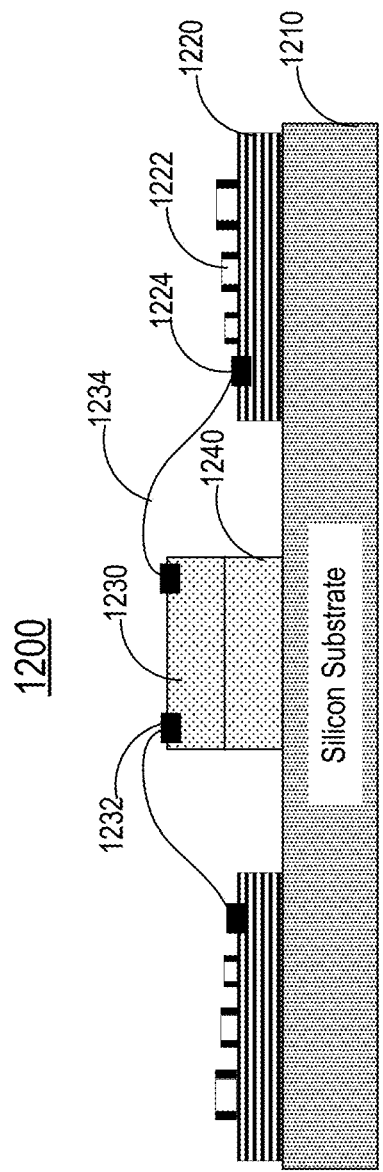
FIG. 12A illustrates an example of a package including an electronic integrated circuit fusion-bonded to a silicon substrate according to certain embodiments.

FIG. 12A illustrates an example of a package 1200 including one or more electronic integrated circuits fusion-bonded to a silicon substrate 1210 according to certain embodiments. Package 1200 may include silicon substrate 1210 and a PCB 1220 bonded on silicon substrate 1210. As described above, depending on the material of PCB 1220, epoxy, fusion bonding, or hybrid bonding may be used to bond PCB 1220 on silicon substrate 1210. PCB 1220 may include traces and planes on multiple layers that are connected through vias. PCB 1220 may also include electronic components, such as capacitors 1222, and solder pads 1224. One or more silicon ICs 1230 and 1240 may be bonded to silicon substrate 1210 through fusion bonding as described above. When two or more silicon ICs are in the package, the two or more silicon ICs may be bonded face-to-face or through TSVs using fusion bonding or hybrid bonding as described above. The top surface of the top IC in the stack may include bonding pads 1232. Bonding wire 1234 may connect bonding pads 1232 to solder pads 1224.

Figure 12B:
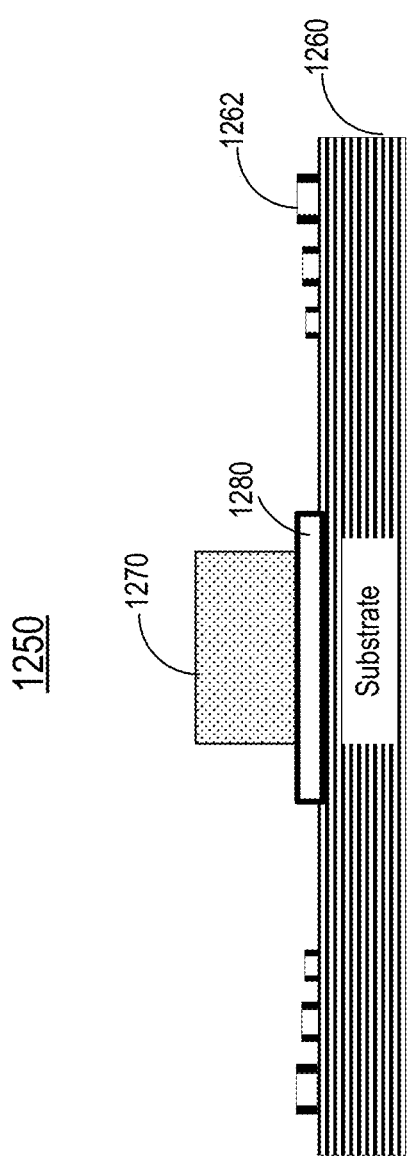
FIG. 12B illustrates an example of a package including an electronic integrated circuit connected to a package substrate through a silicon interposer according to certain embodiments.

FIG. 12B illustrates an example of a package 1250 including an electronic integrated circuit 1270 connected to a package substrate 1260 through a silicon interposer 1280 according to certain embodiments. Package substrate 1260 may include a material that is not a silicon, such as a ceramic, silicon dioxide or other oxide, or an organic material. Package substrate 1260 may include electronic components, such as decoupling capacitors 1262. Silicon interposer 1280 may include a silicon layer that has TSVs but no active devices, and may reduce ESD requirements and thermal resistance. The circuits on electronic integrated circuit 1270 may be electrically connected to package substrate 1260 through silicon interposer 1280. Even though only one electronic integrated circuit 1270 is shown in FIG. 12B, two or more ICs can be used in a stack as described above with respect to FIG. 12A.

Although not shown in the figures, in some embodiments, a cooling device (e.g., a cold head) may be attached to the silicon handle wafer (e.g., silicon handle wafer 440, 610, 910, 1010, or 1110, or silicon substrate 1210) to cool down the PICs and/or the EICs such that the PICs or the EICs may work at the desired temperature, such as cryogenic temperature.

Figure 13:
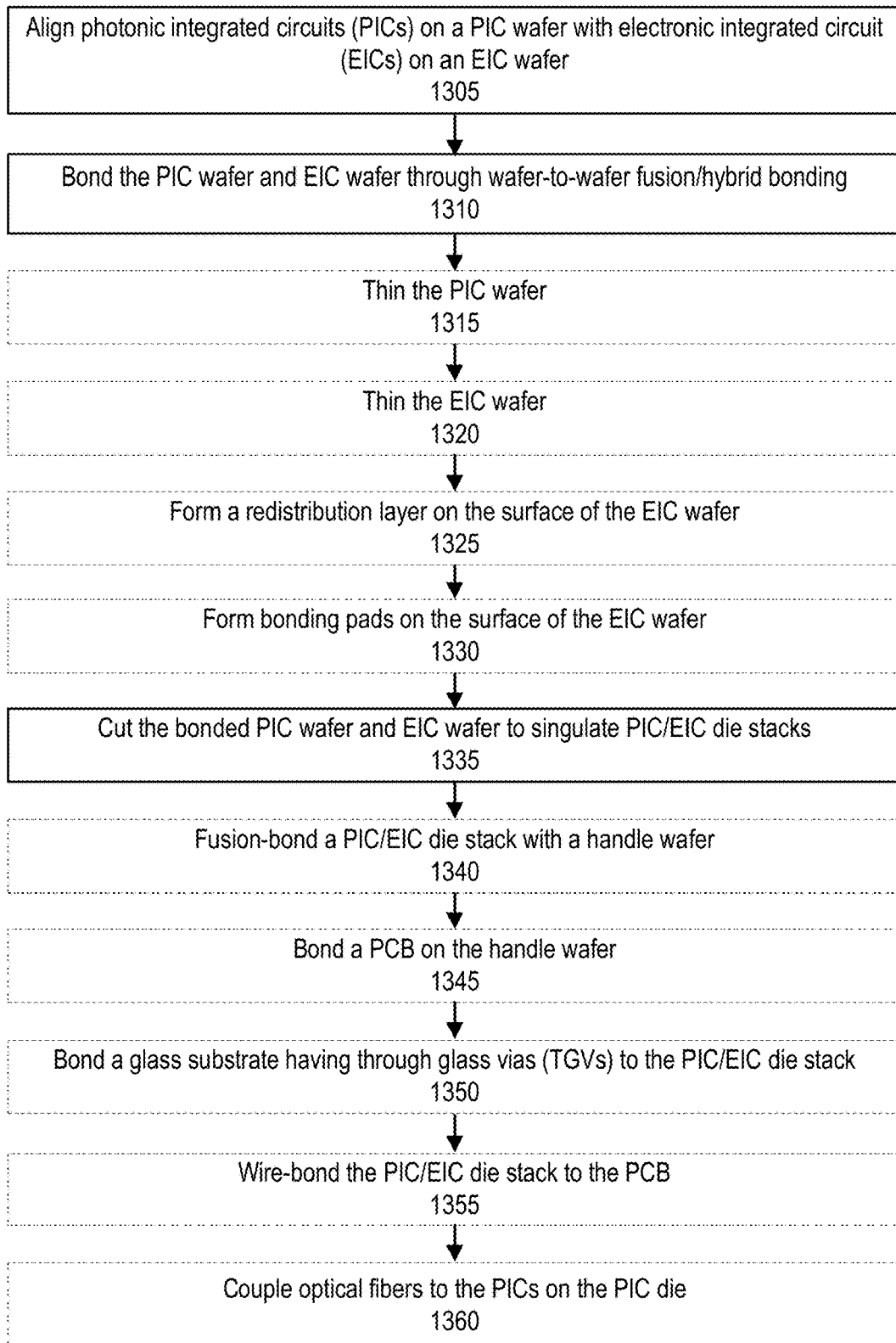
FIG. 13 is a flow chart illustrating an example of a process for bonding photonic integrated circuits and electronic circuits through wafer-to-wafer bonding and die stack singulating according to certain embodiments.

FIG. 13 is a flow chart illustrating an example of a process 1300 for bonding photonic integrated circuits and electronic circuits through wafer-to-wafer bonding and die stack singulating according to certain embodiments. Process 1300 may include, at block 1305, aligning photonic integrated circuits (PICs) on a PIC wafer with electronic integrated circuits (EICs) on an EIC wafer. The PICs may include, for example, waveguides, couplers, resonators, single photon detectors, beam splitters, interferometers, switches, phase shifters, and delay lines. The EICs may include, for example, control logic for herald single photon sources and switches. The PIC wafer and the EIC wafer may include semiconductor wafers, such as silicon wafers. The PICS and the EICs may have been tested before the alignment. The alignment may be based on, for example, pads or traces on the PIC wafer and the EIC wafer.

At block 1310, the PIC wafer and the EIC wafer may be bonded through wafer-to-wafer fusion or hybrid bonding to form a wafer stack. The PIC wafer and the EIC wafer may be bonded face-to-face such that the PICS and EICs may face each other, and the pads and/or traces on the PIC wafer may be in contact with the pads and/or traces on the EIC wafer to form short interconnections with minimum electrical delays. As described above with respect to FIG. 2, wafer-to-wafer fusion bonding may bond two wafers without any intermediate layers and is based on chemical bonds between the surfaces of two wafers that meet certain conditions. Thus, fusion bonding can significantly reduce or substantially eliminate the thermal resistance at the interface between two wafers. In some embodiments, wafer-level metal/adhesive hybrid bonding may be used to bond two wafers with dielectric materials (e.g., oxide) and/or metal at the surface of one or both wafers.

Optionally, the PIC wafer and the EIC wafer may be thinned at blocks 1315 and 1320 respectively by, for example, back-grinding (or back lapping). For example, as described above, the PIC wafer may be back lapped such that its thickness can be reduced about 775 microns to about 100-600 microns, and the EIC wafer may be back grinded such that its thickness can be reduced from about 775 microns to about 50 microns or until through-silicon vias (TSVs) are exposed. At block 1325, one or more redistribution layers (RDLs) may optionally be formed on the backside surface of the EIC wafer. At block 1330, bonding pads may optionally be formed on the backside surface of the EIC wafer, such as on the redistribution layer. The bonding pads may be used to make connections with PCBs.

At block 1335, the wafer stack including the PIC wafer and the EIC wafer that are bonded face-to-face by fusion or hybrid bonding may be cut by, for example, laser or plasma scribing or grinding, to separate each die stack that includes a PIC die and an EIC die.

Optionally, at block 1340, a handle wafer, such as a silicon handle wafer, may be bonded with the backside surface of the PIC die though, for example, fusion bonding as described above. Thus, a stack including the silicon handle wafer, the PIC die, and the EIC die may all include a silicon substrate and may be bonded to form chemical bonds at the interfaces between adjacent substrates. Therefore, the CTEs of the three substrates may be matched and the total thermal resistance from the EIC die to the silicon handle wafer may be relative low because high thermal resistance at the interfaces may be eliminated.

Optionally, at block 1345, a PCB may be aligned with and bonded to the handle wafer at areas where no PIC-EIC die stacks are bonded. The PCB may include, for example, a power distribution network (e.g., power layers and ground layers), voltage regulators, and decoupling capacitors. The PCB may also include, for example, electrical cable connection ports, such as ribbon cable connectors, RF/microwave connectors (e.g., SMA connectors), etc. The bonding method may depend on the material of the PCB. For example, if silicon is used for the PCB, fusion bonding techniques may be used. If oxides, such as silicon dioxide, are used for the PCB, a hybrid bonding technique may be used. If other materials are used for the PCB, an epoxy or an adhesive may be used to attach the PCB to the silicon handle wafer. As described above, in some embodiments, multiple PCB boards may be used in the same package and may be arranged at different horizontal or vertical locations. For example, in some embodiments, one PCB may be positioned on each sides of the die stack. In some embodiments, two or more PCB boards may be positioned vertically with one on top of another.

Optionally, at block 1350, a glass substrate including contact pads connected by through glass vias (TGVs) may be bonded to the die stack. Contact pads on one side of the glass substrate may be coupled to the PICS on PIC die and/or the EICs on EIC die. One example of a die stack bonded to a glass substrate is illustrated in FIG. 11 and described above.

Optionally, at block 1355, the die stack may be wire-bonded to the PCB. For example, the bonding pads on the EIC die and solder pads on PCB may be connected using bonding wires. In embodiments where a glass substrate with TGVs is used, the bonding pads on a second side of the glass substrate may be electrically connected to the bonding pads on the PCB by bonding wires.

Optionally, at block 1360, optical fibers may be coupled to the PICS on the PIC die through, for example, edge couplers. The optical fibers may be attached to V-grooves on the PIC die and also attached to the PCB through fiber harnesses. The optical fibers may be attached to each of two or more sides of the PIC die. In some embodiments, an additional PCB board may be placed above the optical fibers such that the optical fibers may be sandwiched by two PCB boards.

The processing presented in FIG. 13 and described above is intended to be illustrative and non-limiting. Although FIG. 13 depicts the various operations occurring in a particular sequence or order, this is not intended to be limiting. In certain alternative embodiments, the operations may be performed in some different order or some operations may also be performed in parallel. An operation may have additional steps not included in the figure. Some operations may be omitted or combined.

Figure 14:
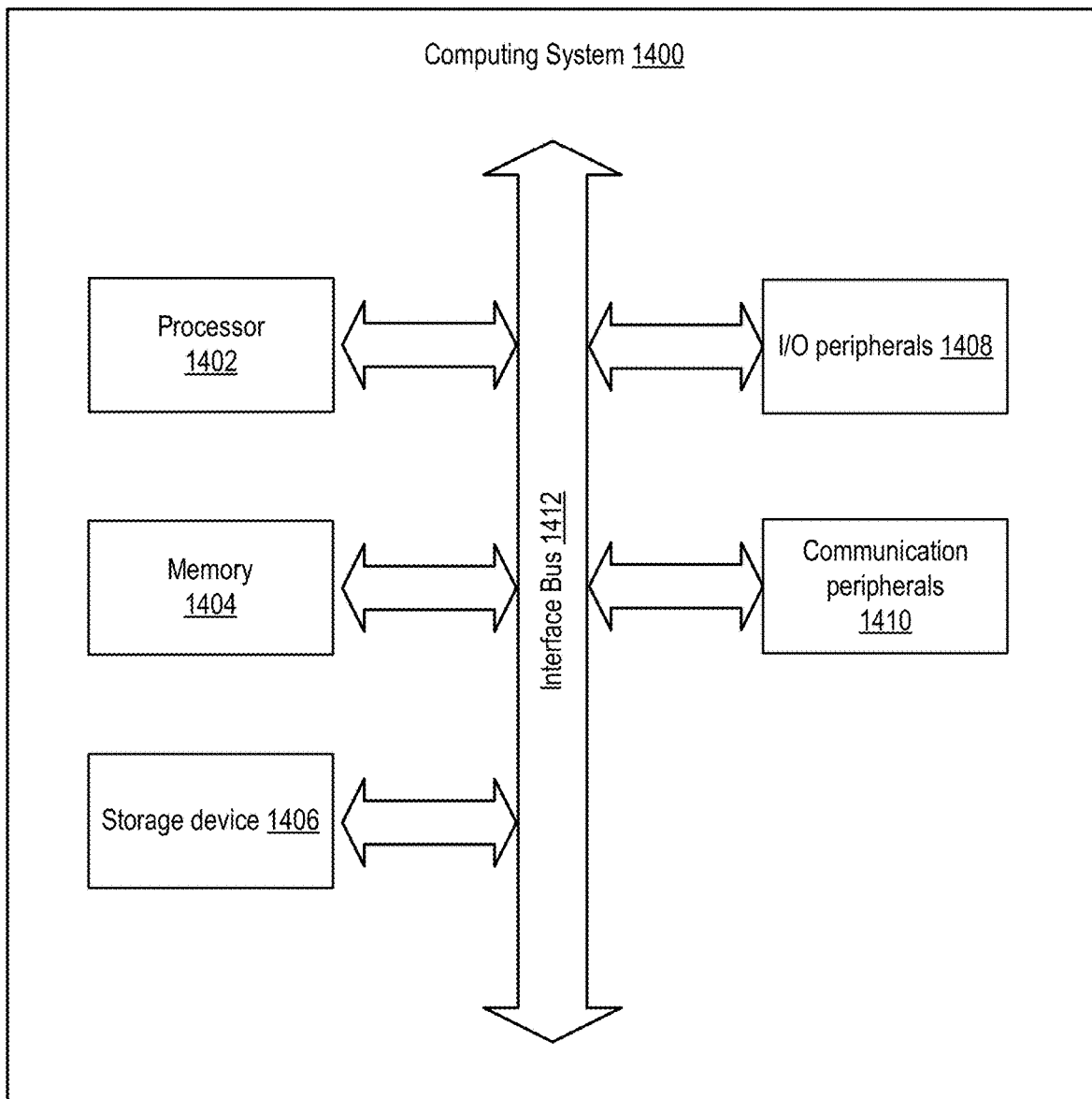
FIG. 14 is a block diagram of an example computing system for implementing some of the examples described herein.

Any suitable computing system or group of computing systems can be used for performing some of the operations described herein. For example, FIG. 14 depicts an example of a computing system 1400 for implementing some of the examples described herein. The implementation of computing system 1400 could be used for one or more of classical computer 140.

The depicted example of a computing system 1400 includes a processor 1402 communicatively coupled to one or more memory devices 1404. The processor 1402 executes computer-executable program code stored in a memory device 1404, accesses information stored in the memory device 1404, or both. Examples of the processor 1402 include a microprocessor, an application-specific integrated circuit ("ASIC"), a field-programmable gate array ("FPGA"), or any other suitable processing device. The processor 1402 can include any number of processing devices, including a single processing device.

A memory device 1404 includes any suitable non-transitory computer-readable medium for storing program code 1415, program data 1416, or both. A computer-readable medium can include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 1400 may also include a number of external or internal devices, an input device 1420, a presentation device 1418, or other input or output devices. For example, computing system 1400 is shown with one or more input/output ("I/O") interfaces 1408. An I/O interface 1408 can receive input from input devices or provide output to output devices. One or more buses 1406 are also included in the computing system 1400. The bus 1406 communicatively couples one or more components of a respective one of the computing system 1400.

The computing system 1400 executes program code 1405 that configures the processor 1402 to perform one or more of the operations described herein. The program code may be resident in the memory device 1404 or any suitable computer-readable medium and may be executed by the processor 1402 or any other suitable processor.

In some embodiments, one or more memory devices 1404 store program data 1407 that includes one or more datasets and models described herein. Examples of these datasets include interaction data, experience metrics, training interaction data or historical interaction data, transition importance data, etc. In some embodiments, one or more of data sets, models, and functions are stored in the same memory device (e.g., one of the memory devices 1404). In additional or alternative embodiments, one or more of the programs, data sets, models, and functions described herein are stored in different memory devices 1404 accessible via a data network.

In some embodiments, the computing system 1400 also includes a network interface device 1410. The network interface device 1410 includes any device or group of devices suitable for establishing a wired or wireless data connection to one or more data networks. Non-limiting examples of the network interface device 1410 include an Ethernet network adapter, a modem, and/or the like. The computing system 1400 is able to communicate with one or more other computing devices (e.g., a computing device executing an environment evaluation system 142) via a data network using the network interface device 1410.

In some embodiments, the computing system 1400 also includes the input device 1420 and the presentation device 1418 depicted in FIG. 14. An input device 1420 can include any device or group of devices suitable for receiving visual, auditory, or other suitable input that controls or affects the operations of the processor 1402. Non-limiting examples of the input device 1420 include a touchscreen, a mouse, a keyboard, a microphone, a separate mobile computing device, etc. A presentation device 1418 can include any device or group of devices suitable for providing visual, auditory, or other suitable sensory output. Non-limiting examples of the presentation device 1418 include a touchscreen, a monitor, a speaker, a separate mobile computing device, etc.

Although FIG. 14 depicts the input device 1420 and the presentation device 1418 as being local to the computing device that executes the environment evaluation system 142, other implementations are possible. For instance, in some embodiments, one or more of the input device 1420 and the presentation device 1418 can include a remote client-computing device that communicates with the computing system 1400 via the network interface device 1410 using one or more data networks described herein.

It will be apparent to those skilled in the art that substantial variations may be made in accordance with specific implementations. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The terms "machine-readable medium" and "computer-readable medium" as used herein refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media, punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, compact disc read-only memory (CD-ROM) or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

What is claimed is:

1. A device comprising:
   a die stack including:
      a first die including a quantum computing circuit;
      a second die including an electronic circuit, wherein the second die and the first die face each other;
      a first interconnect between the quantum computing circuit and the electronic circuit; and
      a second interconnect between the quantum computing circuit and the electronic circuit.

2. The device of claim 1, wherein:
   the first interconnect comprises:
      a first end disposed in the first die and coupled to a photodetector in the quantum computing circuit; and
      a second end disposed in the second die and coupled to a logic circuit in the electronic circuit;
   the second interconnect comprises:
      a first end disposed in the second die and coupled to an output of the logic circuit;
      a second end disposed in the first die and coupled to an optical switch in the quantum computing circuit; and
   the logic circuit is configured to control the optical switch based on a detection of a single photon by the photodetector.

3. The device of claim 1, wherein the die stack is disposed on a silicon substrate.

4. The device of claim 3, wherein a surface of the first die is fusion bonded to the silicon substrate.

5. The device of claim 1, wherein the first interconnect and the second interconnect are metal interconnects.

6. The device of claim 1, wherein the second die and the first die are bonded face-to-face, and a bonded surface between the second die and the first die is a fusion bonded surface.

7. The device of claim 1, wherein the first die comprises a photonic integrated circuit die (PIC die).

8. The device of claim 7, wherein the quantum computing circuit comprises a photonic integrated circuit (PIC).

9. The device of claim 1, wherein the quantum computing circuit comprises a photon detector employed in a quantum computer.

10. The device of claim 1, wherein the second die is an electronic integrated circuit die (EIC die).

11. The device of claim 10, wherein the electronic circuit is an electronic integrated circuit (EIC).

* * * * *